US012690189B2

(12) United States Patent
Lee et al.

(10) Patent No.: US 12,690,189 B2
(45) Date of Patent: Jul. 21, 2026

(54) SEMICONDUCTOR MEMORY DEVICE

(71) Applicant: Samsung Electronics Co., Ltd.,
Suwon-si (KR)

(72) Inventors: Juho Lee, Suwon-si (KR); Seongjae Byeon, Suwon-si (KR); Wonsok Lee, Suwon-si (KR); Jeon Il Lee, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 289 days.

(21) Appl. No.: 18/402,790

(22) Filed: Jan. 3, 2024

(65) Prior Publication Data

US 2024/0397708 A1      Nov. 28, 2024

(30) Foreign Application Priority Data

May 24, 2023      (KR) ......................... 10-2023-0066986

(51) Int. Cl.
*H10B 12/00*      (2023.01)
(52) U.S. Cl.
CPC ......... *H10B 12/488* (2023.02); *H10B 12/315* (2023.02); *H10B 12/482* (2023.02)
(58) Field of Classification Search
CPC .. H10B 12/488; H10B 12/315; H10B 12/482; H10B 12/05; H10B 12/30; H10B 12/02; H10B 61/22; H10B 63/34; H10D 30/63; H10D 62/80
See application file for complete search history.

(56) References Cited

U.S. PATENT DOCUMENTS

| | | | |
|---|---|---|---|
| 11,398,571 B2 | 7/2022 | Ramaswamy et al. | |
| 2018/0269320 A1* | 9/2018 | Chi ........................ | H10D 84/83 |
| 2019/0067278 A1* | 2/2019 | Seo ....................... | H10D 62/115 |
| 2022/0102352 A1 | 3/2022 | Lee et al. | |
| 2022/0199625 A1 | 6/2022 | Lee et al. | |
| 2022/0223604 A1 | 7/2022 | Park et al. | |
| 2022/0238641 A1 | 7/2022 | Park et al. | |

(Continued)

FOREIGN PATENT DOCUMENTS

| | | | |
|---|---|---|---|
| KR | 20210054019 A | 5/2021 | |

OTHER PUBLICATIONS

Agrawal et al. "Analysis of Negative Bias Illumination Stress Induced Effect on LTPS and a-IGZO TFT" ECS Journal of Solid State Science and Technology 9(10):106005 (Nov. 2020).

(Continued)

*Primary Examiner* — Jonathan Han
(74) *Attorney, Agent, or Firm* — Wolf, Greenfield & Sacks, P.C.

(57)      ABSTRACT

A semiconductor memory device includes a bit line on a substrate and extending in a first direction parallel to a top surface of the substrate, a channel pattern connected to a top surface of the bit line and extending in a second direction perpendicular to the top surface of the substrate, a first drain pattern on the channel pattern, a first word line adjacent to a lower portion of the first drain pattern and the channel pattern, and a gate insulating layer between the lower portion of the first drain pattern and the first word line and between the channel pattern and the first word line. An energy band gap of a first material of the first drain pattern is greater than an energy band gap of a second material of the channel pattern.

20 Claims, 37 Drawing Sheets

(56)     References Cited

U.S. PATENT DOCUMENTS

2023/0005917 A1    1/2023  Kim et al.
2023/0009575 A1    1/2023  Cho et al.

OTHER PUBLICATIONS

Chang et al. "Temperature-Dependent Instability of Bias Stress in InGaZnO Thin-Film Transistors" IEEE Transactions on Electron Devices 61(6):2119-2124 (Jun. 2014).

* cited by examiner

SEMICONDUCTOR MEMORY DEVICE

CROSS-REFERENCE TO RELATED APPLICATION(S)

This U.S. non-provisional patent application claims priority under 35 U.S.C. § 119 to Korean Patent Application No. 10-2023-0066986, filed on May 24, 2023, in the Korean Intellectual Property Office, the entire contents of which are hereby incorporated by reference.

BACKGROUND

The present disclosure relates generally to a semiconductor memory device, and more particularly, to a semiconductor memory device including vertical channel transistors and a method of manufacturing the same.

As design rules of semiconductor devices have been reduced, manufacturing techniques have been developed to improve integration densities, operating speeds and yields of semiconductor devices. Thus, a transistor having a vertical channel has been suggested to increase an integration density, a resistance and a current driving ability of a transistor.

SUMMARY

Embodiments of the inventive concepts may provide a semiconductor memory device capable of improving electrical characteristics and an integration density.

In an aspect, a semiconductor memory device may include a bit line disposed on a substrate and extending in a first direction, a channel pattern connected to a top surface of the bit line and extending in a second direction perpendicular to a top surface of the substrate, a first drain pattern disposed on the channel pattern, a first word line adjacent to a lower portion of the first drain pattern and the channel pattern, and a gate insulating layer disposed between the lower portion of the first drain pattern and the first word line and between the channel pattern and the first word line. An energy band gap of a first material of the first drain pattern may be greater than an energy band gap of a second material of the channel pattern.

In an aspect, a semiconductor memory device may include a bit line disposed on a substrate and extending in a first direction, a first word line disposed on the bit line and intersecting the bit line, a channel pattern connected to a top surface of the bit line and disposed adjacent to a side of the first word line, a first drain pattern in contact with a top surface of the channel pattern, a gate insulating layer between the channel pattern and the first word line, and a landing pad on the first drain pattern. A lower portion of the first drain pattern may horizontally overlap the first word line. An upper portion of the first drain pattern may vertically overlap the first word line. The channel pattern and the first drain pattern may include different materials.

In an aspect, a semiconductor memory device may include a first interlayer insulating layer disposed on a substrate, bit lines extending in a first direction on the first interlayer insulating layer and spaced apart from each other in a second direction intersecting the first direction, a second interlayer insulating layer filling a space between the bit lines, a first insulating structure disposed on the bit lines and the second interlayer insulating layer and extending in the second direction, channel patterns being in contact with a side surface of the first insulating structure and spaced apart from each other in the second direction, the channel patterns connected to the bit lines, respectively, a first word line covering side surfaces of the channel patterns and extending in the second direction, a gate insulating layer disposed between the first word line and the channel patterns, drain patterns disposed between the first word line and the first insulating structure and being in contact with top surfaces of the channel patterns, respectively, and landing pads on the drain patterns. The channel patterns may include silicon, and the drain patterns may include an oxide semiconductor. Each of bottom surfaces of the drain patterns may have a first level, and a top surface of the first word line may have a second level higher than the first level.

DETAILED DESCRIPTION

Figure 1:
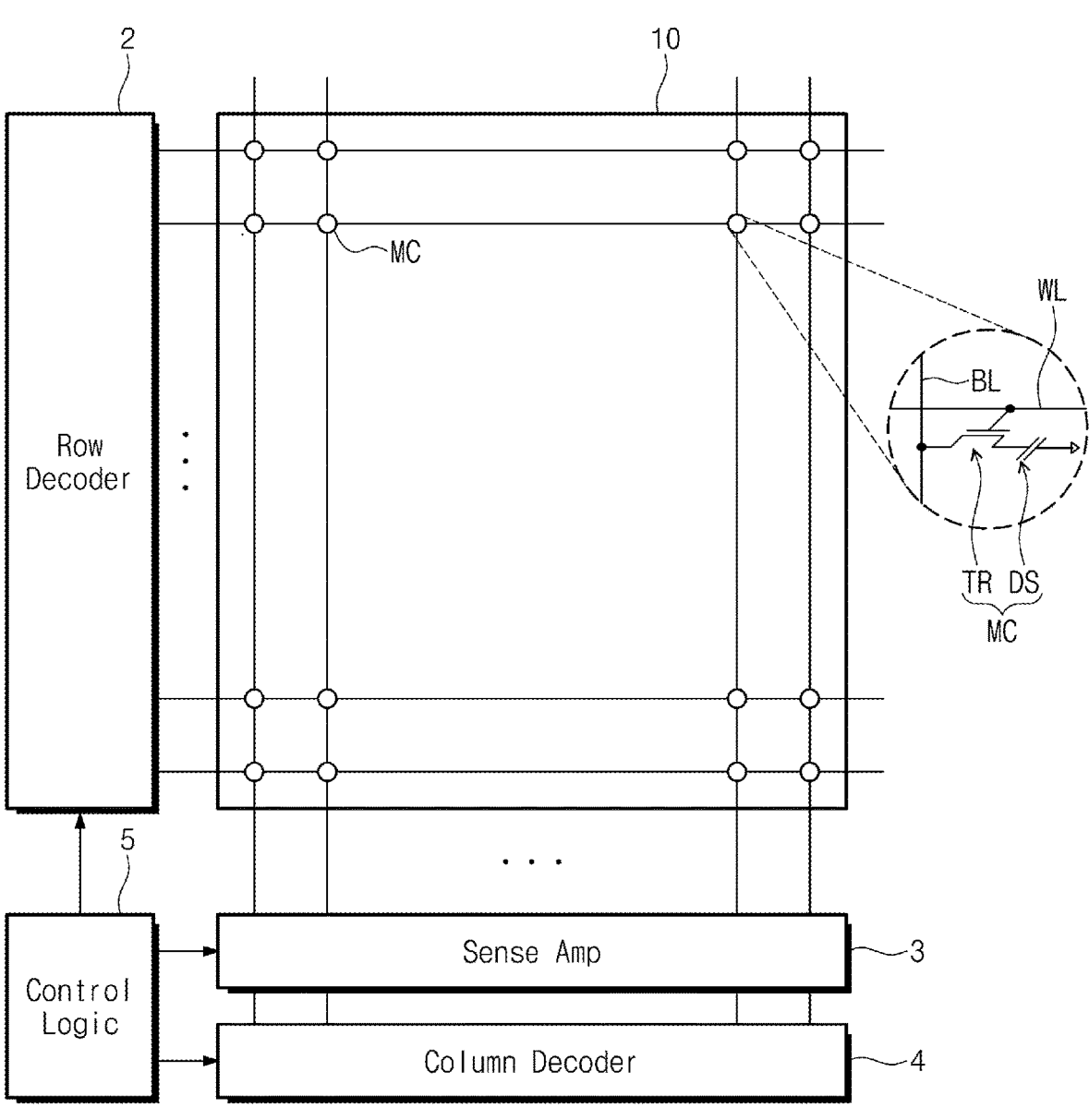
FIG. 1 is a block diagram illustrating a semiconductor memory device according to some embodiments of the inventive concepts.

Embodiments of the inventive concepts will now be described more fully with reference to the accompanying drawings, wherein like reference numerals represent like elements. As will become apparent to those skilled in the art, the described embodiments may be modified in various different ways, all without departing from the spirit or scope of the present inventive concept.

FIG. 1 is a block diagram illustrating a semiconductor memory device according to some embodiments of the inventive concepts.

Referring to FIG. 1, a semiconductor memory device may include a memory cell array 10, a row decoder 2, a sense amplifier 3, a column decoder 4, and a control logic 5.

The memory cell array 10 may include a plurality of memory cells MC two-dimensionally or three-dimensionally arranged. Each of the memory cells MC may be connected between a word line WL and a bit line BL which intersect each other.

Each of the memory cells MC may include a selection element TR and a data storage element DS, and the selection element TR and the data storage element DS may be electrically connected in series to each other. The selection element TR may be connected between the data storage element DS and the word line WL, and the data storage element DS may be connected to the bit line BL through the selection element TR, although alternative arrangements are contemplated. The selection element TR may be a field-effect transistor (FET), and the data storage element DS may be realized as a capacitor, a magnetic tunnel junction pattern, or a variable resistor. For example, the selection element TR may include a transistor, a gate electrode of the transistor may be connected to the word line WL, and drain/source terminals of the transistor may be connected to the bit line BL and the data storage element DS, respectively.

The row decoder 2 may decode an address signal inputted from the outside to select one among the plurality of word lines WL of the memory cell array 10. The address signal decoded in the row decoder 2 may be provided to a row driver (not explicitly shown), and the row driver may respectively provide predetermined voltages to the selected word line WL and unselected word lines WL in response to control signals of control circuits.

The sense amplifier 3 may sense and amplify a voltage difference between a selected bit line BL and a reference bit line and may output the amplified voltage difference. The selected bit line BL may be determined by an address signal decoded from the column decoder 4.

The column decoder 4 may provide a data transmission path between the sense amplifier 3 and an external device (e.g., a memory controller). The column decoder 4 may decode an address signal inputted from the outside to select one among the plurality of bit lines BL.

The control logic 5 may generate control signals for controlling operations of writing and/or reading data to/from the memory cells MC in the memory cell array 10 and may provide the control signals to the row decoder 2, the sense amplifier 3 and/or the column decoder 4.

Figure 2:
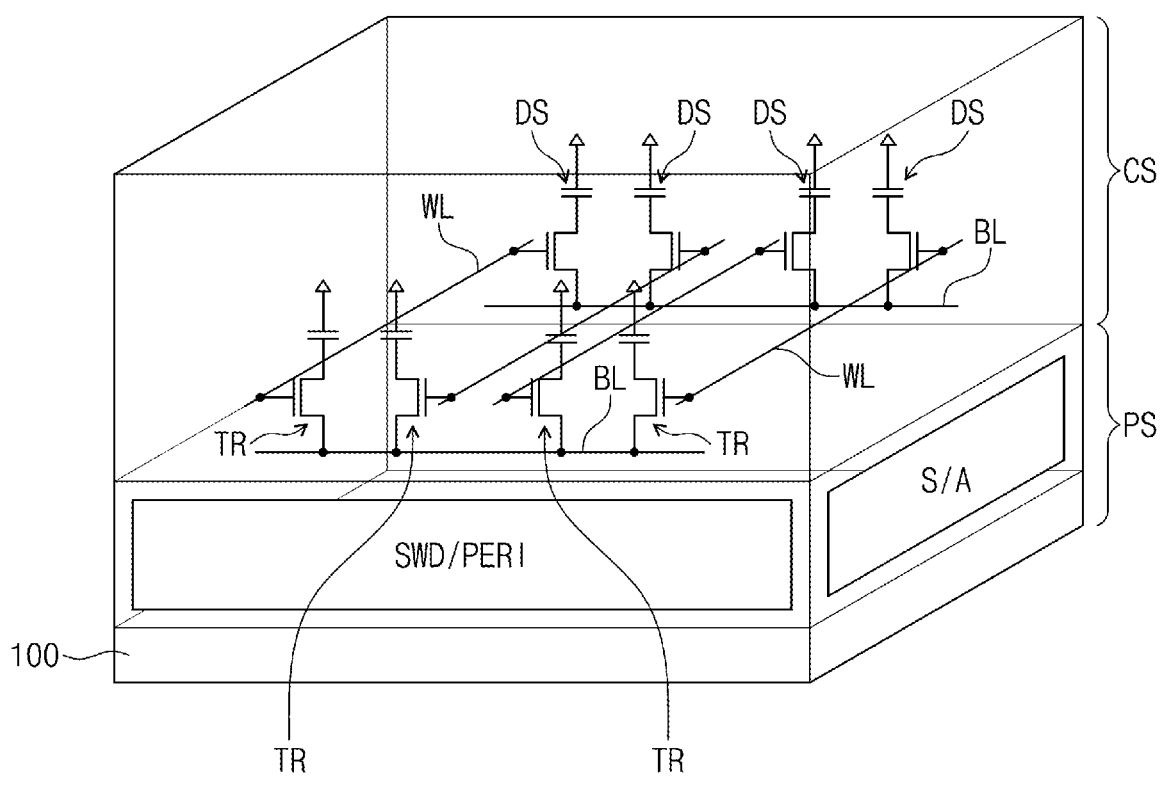
FIG. 2 is a perspective view schematically illustrating a semiconductor memory device according to some embodiments of the inventive concepts.

FIG. 2 is a perspective view schematically illustrating a semiconductor memory device according to some embodiments of the inventive concepts.

Referring to FIG. 2, a semiconductor memory device may include a peripheral circuit structure PS on a semiconductor substrate 100, and a cell array structure CS on the peripheral circuit structure PS.

The peripheral circuit structure PS may include core and peripheral circuits formed on the semiconductor substrate 100. The core and peripheral circuits may include the row and column decoders 2 and 4 (see FIG. 1), the sense amplifier (S/A) 3 (see FIG. 1) and the control logic 5 (see FIG. 1), described with reference to FIG. 1. The peripheral circuit structure PS may be provided between the semiconductor substrate 100 and the cell array structure CS in a third direction D3 perpendicular to a top surface of the semiconductor substrate 100.

The cell array structure CS may include bit lines BL, word lines WL, and memory cells MC (see FIG. 1) between the bit lines BL and the word lines WL; each memory cell MC may be independently addressable through a unique pair of a bit line BL and word line WL. The memory cells MC (see FIG. 1) may be two-dimensionally or three-dimensionally arranged on a plane extending in first and second directions D1 and D2, respectively, which intersect each other and are parallel to the top surface of the substrate 100. As described above, each of the memory cells MC (see FIG. 1) may include the selection element TR and the data storage element DS.

In some embodiments, the selection element TR of each of the memory cells MC (see FIG. 1) may include a vertical channel transistor (VCT). The vertical channel transistor may mean a transistor having a structure in which a channel length extends in a direction (i.e., the third direction D3) perpendicular to the top surface of the semiconductor substrate 100. In addition, a capacitor may be provided as the data storage element DS of each of the memory cells MC (see FIG. 1).

Figure 3A:
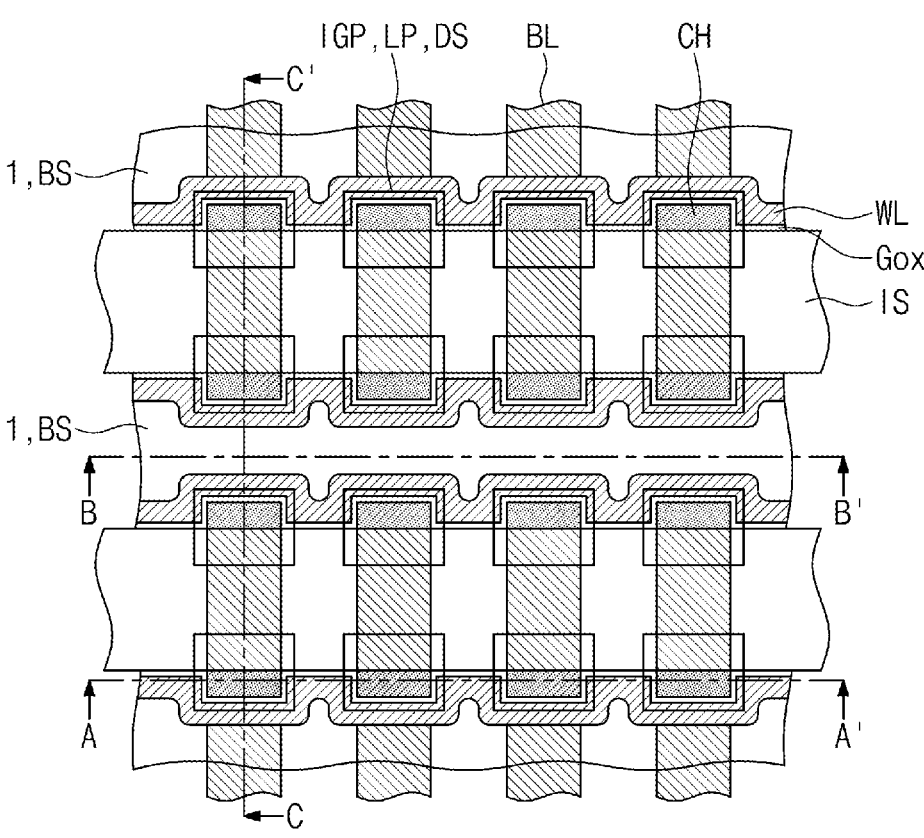
FIG. 3A is a plan view illustrating a semiconductor memory device according to some embodiments of the inventive concepts.
Figure 3A:
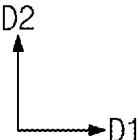
Figure 3B:
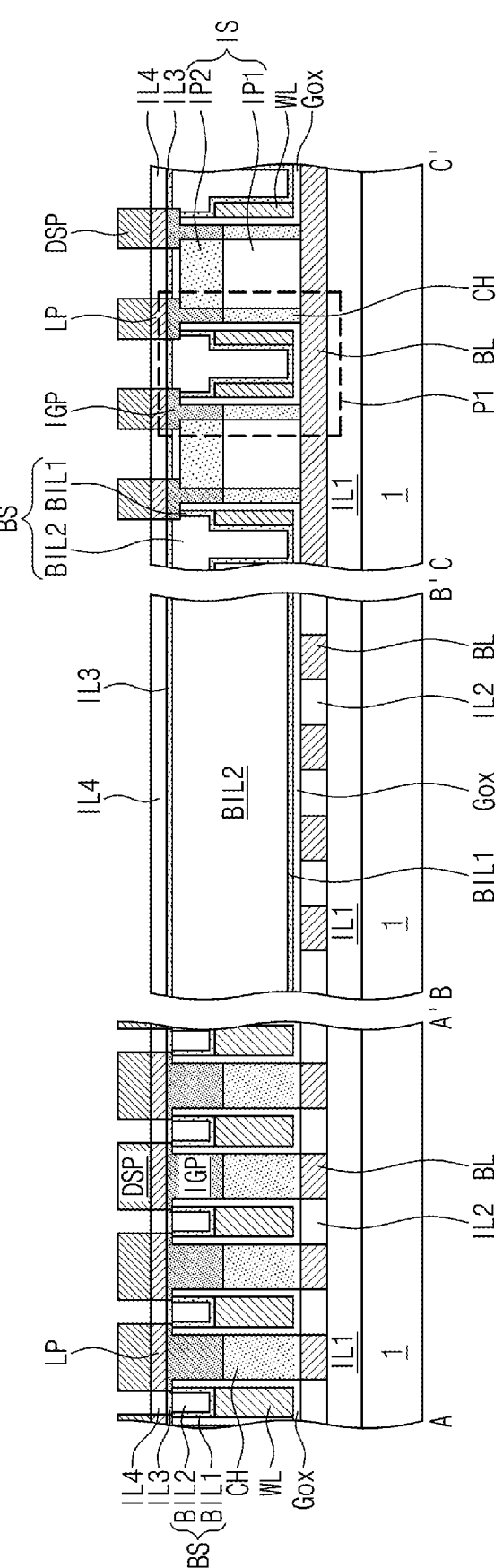
FIG. 3B is a cross-sectional view taken along lines A-A', B-B' and C-C' of FIG. 3A to illustrate a semiconductor memory device according to some embodiments of the inventive concepts.

FIG. 3A is a plan view illustrating at least a portion of an example semiconductor memory device according to some embodiments of the inventive concepts. FIG. 3B is a cross-sectional view taken along lines A-A', B-B' and C-C' of FIG. 3A to illustrate a semiconductor memory device according to some embodiments of the inventive concepts. FIGS. 4A to 4F are enlarged views of a portion 'P1' of FIG. 3B according to some embodiments of the inventive concepts.

Figure 4A:
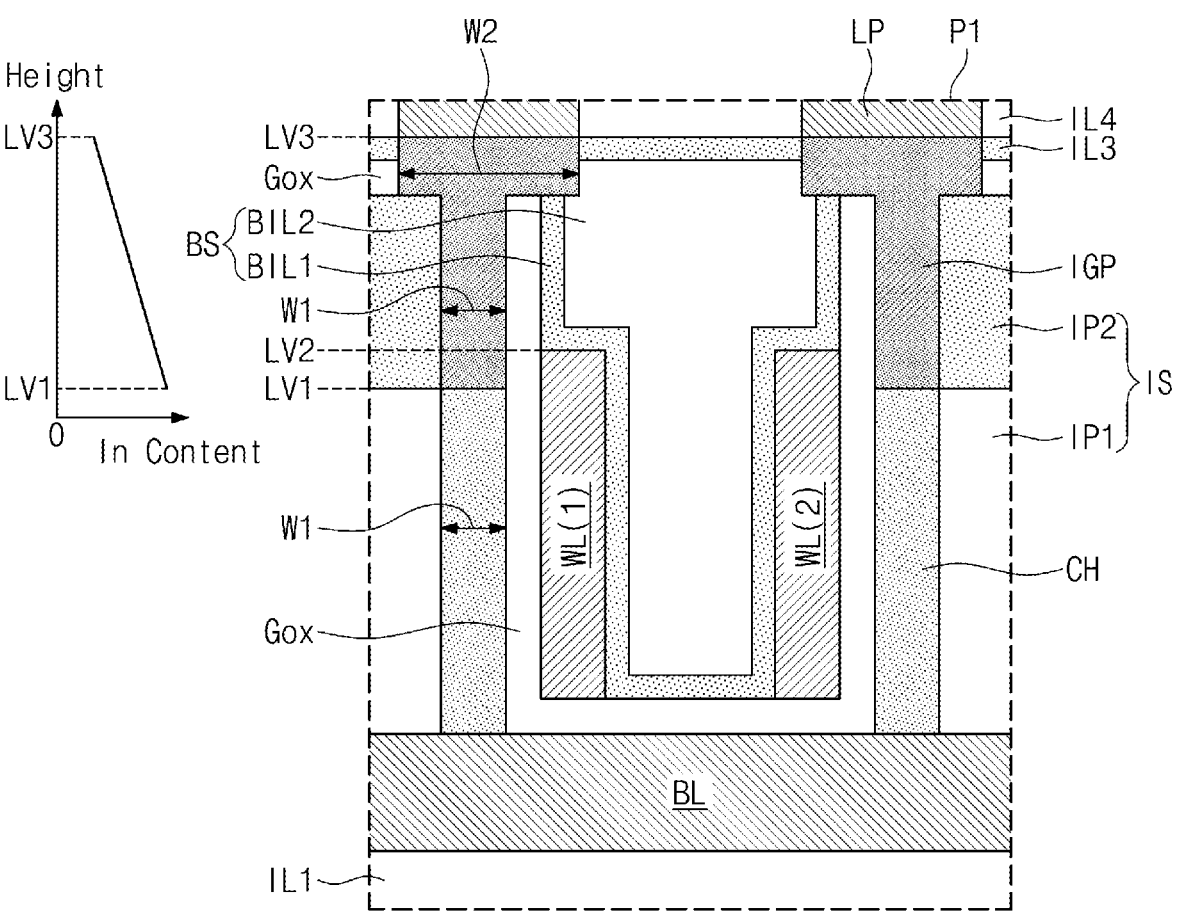
FIGS. 4A to 4F are enlarged views of a portion 'P1' of FIG. 3B according to some embodiments of the inventive concepts.

Referring to FIGS. 3A, 3B and 4A, a first interlayer insulating layer IL1 may be disposed on a substrate 1. The substrate 1 may be, for example, a single-crystalline silicon substrate or a silicon-on-insulator (SOI) substrate. Even though not shown in the drawings, the core and peripheral circuits described above may be formed on the substrate 1, and the core and peripheral circuits may be covered with the first interlayer insulating layer IL1. The first interlayer insulating layer IL1 may have a single-layered or multi-layered structure including at least one of silicon oxide, silicon nitride, silicon oxynitride, or a porous insulating material.

Bit lines BL may be disposed on the first interlayer insulating layer IL1. The bit lines BL may extend in a second direction D2 and may be spaced apart from each other in a first direction D1 intersecting the second direction D2. The first and second directions D1 and D2 may be parallel to a top surface of the substrate 1. For example, the bit lines BL may include doped poly-silicon, a metal, a conductive metal nitride, a conductive metal silicide, a conductive metal oxide, or any combination thereof. The bit lines BL may be formed of, but not limited to, poly-silicon doped with dopants, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. The bit lines BL may include a single layer or multi-layer of the aforementioned materials. In some embodiments, the bit lines BL may include a two-dimensional or three-dimensional material and may include, for example, graphene corresponding to a carbon-based two-dimensional material, carbon nanotube corresponding to the three-dimensional material, or a combination thereof.

A space between the bit lines BL may be filled with a second interlayer insulating layer IL2. The term "filled" (or "fill," or like terms) as may be used herein is intended to refer broadly to either completely filling a defined space (e.g., the space between the bit lines BL) or partially filling the defined space; that is, the defined space need not be entirely filled but may, for example, be partially filled or have voids or other spaces throughout. The second interlayer insulating layer IL2 may have a single-layered or multi-layered structure including at least one of silicon oxide, silicon nitride, silicon oxynitride, or a porous insulating material. A top surface of the second interlayer insulating layer IL2 may be coplanar with top surfaces of the bit lines BL; that is, the top surface of the second interlayer insulating layer IL2 may be at the same height, relative to the top surface of the substrate 1, as the top surface of the bit lines BL.

First insulating structures IS may be disposed on the bit lines BL and the second interlayer insulating layer IL2. The first insulating structures IS may have line shapes extending in the first direction D1 and may be spaced apart from each other in the second direction D2, when viewed in the plan view of FIG. 3A. The first insulating structures IS may intersect the bit lines BL. Each of the first insulating structures IS may include a first insulating pattern IP1 and a second insulating pattern IP2 which are sequentially stacked in a third direction D3 perpendicular to the top surface of the substrate 1. The first insulating pattern IP1 and the second insulating pattern IP2 may be formed of materials having etch selectivity with respect to each other. For example, the first insulating pattern IP1 may be formed of silicon oxide, and the second insulating pattern IP2 may be formed of silicon nitride.

Channel patterns CH may cover both side surfaces of each of the first insulating structures IS. The channel pattern CH may also be referred to as 'a silicon pattern CH'. Bottom surfaces of each of the channel patterns CH may be in contact with the top surfaces of the corresponding bit lines BL. The channel patterns CH may be spaced apart from each other in the first direction D1 and the second direction D2. The channel patterns CH may be formed of silicon. The channel patterns CH may include poly-silicon or single-crystalline silicon, which is doped with dopants or is undoped. An energy band gap of the silicon may be about 1.12 electron volts (eV). Top surfaces of the channel patterns CH may be lower in height than a top surface of the first insulating structure IS, relative to the top surface of the substrate 1.

Side surfaces of the channel patterns CH may be conformally covered with a gate insulating layer Gox. The term "conformally" (or "conformal," or like terms), as may be used herein in the context of a material layer or coating, is intended to refer broadly to a material layer or coating having a substantially uniform cross-sectional thickness relative to the contour of a surface to which the material layer is applied. For example, the gate insulating layer Gox may have a single-layered or multi-layered structure including at least one of silicon oxide, silicon nitride, or a metal oxide. A word line WL may be spaced apart from the channel pattern CH with the gate insulating layer Gox interposed therebetween. The word line WL may extend in the first direction D1 in the plan view of FIG. 3A, and a side surface of the word line WL may have an uneven contour when viewed in the plan view of FIG. 3A. The term "uneven" as used herein may be defined as having a shape that is not straight or parallel. The word line WL may be formed of, but not limited to, poly-silicon doped with dopants, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. A top surface of the word line WL may be higher than the top surface of the channel pattern CH (in the third direction D3), relative to the top surface of the substrate 1. The word line WL may be provided in plurality. The word lines WL may cover both side surfaces of the first insulating structure IS, respectively.

Referring to FIG. 4A, a second insulating structure BS may be disposed between a pair of word lines WL(1) and WL(2) disposed between the first insulating structures IS. The pair of word lines WL(1) and WL(2) may include first and second word lines WL(1) and WL(2). The gate insulating layer Gox disposed between the first word line WL(1) and the channel pattern CH adjacent thereto may extend to cover the top surface of the bit line BL and may further extend between the second word line WL(2) and the channel pattern CH adjacent thereto.

The second insulating structure BS may include a first buried liner BIL1 and a second buried pattern BIL2 which are sequentially stacked. The first buried liner BIL1 and the second buried pattern BIL2 may include different materials. For example, the first buried liner BIL1 may include silicon nitride, and the second buried pattern BIL2 may include silicon oxide. The first buried liner BIL1 may have a uniform thickness regardless of its position. The first buried liner BIL1 may conformally cover side surfaces and top surfaces of the pair of word lines WL(1) and WL(2) and the gate insulating layer Gox. The first buried liner BIL1 may conformally cover a side surface and a bottom surface of the second buried pattern BIL2. The second buried pattern BIL2 may fill a space between the first insulating structures IS. The second buried pattern BIL2 may have a T-shaped cross section, in some embodiments.

The gate insulating layer Gox may extend to cover the top surface of the first insulating structure IS. A third interlayer insulating layer IL3 may be disposed on the first insulating structure IS and the second insulating structure BS.

A drain pattern IGP may penetrate (i.e., extend into) the third interlayer insulating layer IL3 and the gate insulating layer Gox and may be disposed between an upper portion of the second insulating structure BS and an upper portion of the first insulating structure IS. A bottom surface of the drain pattern IGP may be in contact with the top surface of the channel pattern CH. The drain pattern IGP may also be referred to as 'a first oxide semiconductor pattern IGP'. Each of a lower portion of the drain pattern IGP and the channel pattern CH may have a first width W1 (FIG. 4A) in the second direction D2. An upper portion of the drain pattern IGP may have a second width W2 (FIG. 4A) in the second direction D2, which is greater than the first width W1. The drain pattern IGP may vertically overlap the first insulating structure IS. The term "overlap" (or "overlapping," or like terms), as used herein, is intended to broadly refer to a first element that intersects with at least a portion of a second element in the vertical direction (i.e., third direction D3), but does not require that the first and second elements be completely aligned with one another in a horizontal plane (i.e., in the first and second directions D1, D2). In the present embodiments, the drain pattern IGP may have a T-shaped cross section. The upper portion of the drain pattern IGP may be in contact with the gate insulating layer Gox and the second insulating structure BS and may partially overlap the word line WL when viewed in a plan view.

The lower portion of the drain pattern IGP may horizontally overlap the word line WL. The bottom surface of the drain pattern IGP may have a first level LV1, and the top surface of the word line WL may have a second level LV2 higher than the first level LV1. A top surface of the drain pattern IGP may have a third level LV3 and may be higher than the top surface of the first insulating structure IS. The first, second and third levels LV1, LV2, LV3 may be referenced as a height in the third direction D3 relative to the top surface of the substrate 1. The top surface of the drain pattern IGP may be coplanar with a top surface of the third interlayer insulating layer IL3, relative to the top surface of the substrate 1.

The drain pattern IGP may be formed of a material having an energy band gap higher than the energy band gap of the silicon of the channel pattern CH. For example, the drain pattern IGP may be formed of an oxide semiconductor. An energy band gap of the oxide semiconductor may range from about 2.0 eV to about 5.0 eV. The drain pattern IGP may include $In_xGa_yZn_zO$ (or IGZO), $In_xGa_ySi_zO$, $In_xSn_yZn_zO$ (or ITZO), $In_xZn_yO$, $In_xGa_yO$, $In_2O_3$, $In_xSn_yO$ (or indium tin oxide (ITO)), or any combination thereof. In the drain pattern IGP, a content of indium (In) may be greater than contents of other elements (Ga, Zn, Sn) and may range from, for example, about 20 atomic percent (at %) to about 80 at %. The content of indium (In) in a lower portion of the drain pattern IGP may be higher than the content of indium (In) in an upper portion of the drain pattern IGP. For example, the content of indium (In) in the drain pattern IGP may become progressively higher toward an interface between the drain pattern IGP and the channel pattern CH (i.e., the first level LV1). The content property of indium may prevent a silicon oxide layer from being formed between the drain pattern IGP and the channel pattern CH, thereby reducing a contact resistance between the drain pattern IGP and the channel pattern CH. The drain pattern IGP may have an N-type conductivity.

Landing pads LP may be disposed on the drain patterns IGP. The landing pads LP may be formed of, but not limited to, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrOx), ruthenium oxide (RuOx), or any combination thereof. A space between the landing pads LP may be filled with a fourth interlayer insulating layer IL4. Data storage elements DS may be disposed on the landing pads LP.

The channel pattern CH, the drain pattern IGP connected thereto, the word line WL adjacent thereto and the gate insulating layer Gox disposed therebetween may constitute the selection element TR of FIG. 1 or a transistor. The channel pattern CH may correspond to a channel portion in the selection element TR. In addition, the drain pattern IGP may correspond to a drain portion in the selection element TR.

According to the inventive concepts, the channel portion may be formed of silicon, and thus a threshold voltage may not be changed according to an operating temperature of the selection element TR. In addition, the drain portion may be formed of an oxide semiconductor having the energy band gap higher than that of the channel portion, and thus a gate-induced drain leakage (GIDL) may be reduced or prevented. Thus, a loss of charges stored in the data storage element DS may be reduced or prevented. As a result, reliability of the semiconductor memory device may be improved.

Figure 4B:
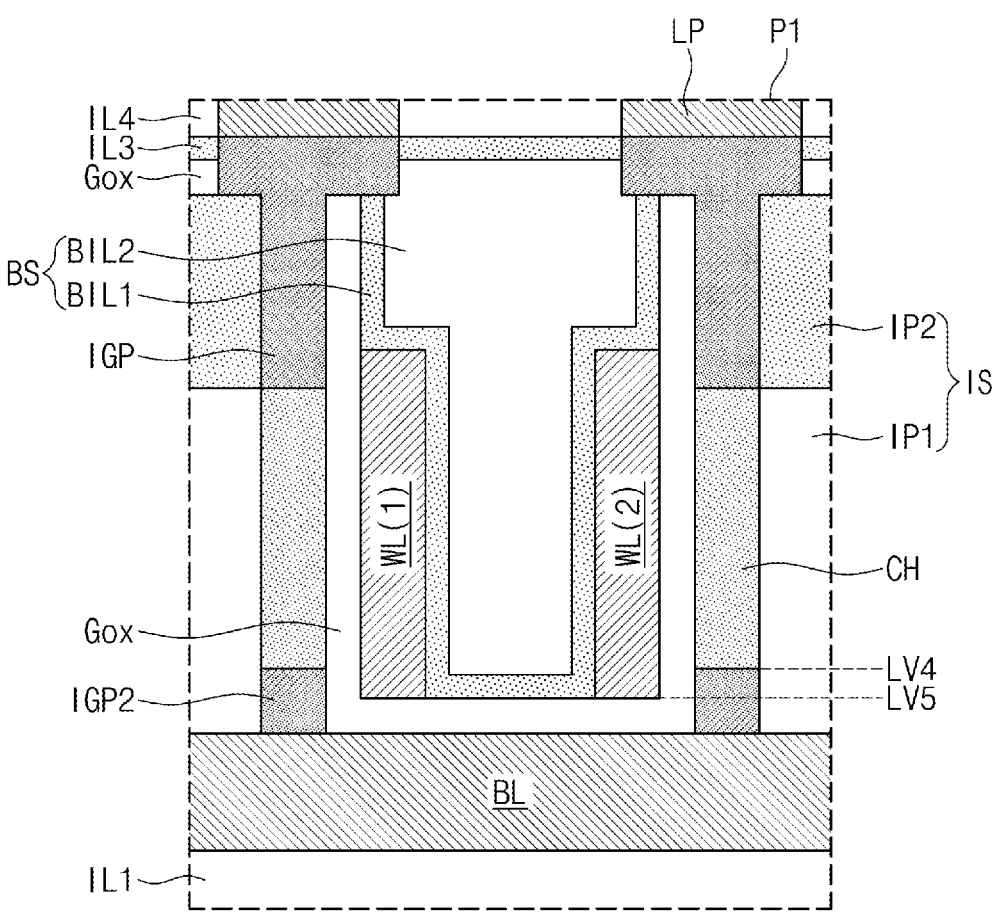

Referring to FIG. 4B, a source pattern IGP2 may be disposed between the channel pattern CH and the bit line BL in the third direction D3. An upper portion of the source pattern IGP2 may horizontally overlap (i.e., in the first direction D1 and/or second direction D2) the word line WL. A top surface of the source pattern IGP2 may have a fourth level LV4. A bottom surface of the word line WL may have a fifth level LV5 lower than the fourth level LV4. The fourth and fifth levels LV4, LV5 may be referenced with respect to a height above the top surface of the substrate 1.

The source pattern IGP2 may be formed of a material having an energy band gap higher than the energy band gap of the silicon of the channel pattern CH. For example, the source pattern IGP2 may be formed of an oxide semiconductor. The energy band gap of the oxide semiconductor may range from about 2.0 eV to about 5.0 eV. The source pattern IGP2 may include $In_xGa_yZn_zO$ (or IGZO), $In_xGa_y$-$Si_zO$, $In_xSn_yZn_zO$ (or ITZO), $In_xZn_yO$, $In_xGa_yO$, $In_2O_3$, $In_xSn_yO$ (or indium tin oxide (ITO)), or any combination thereof. In the source pattern IGP2, a content of indium (In) may be greater than contents of other elements (Ga, Zn, Sn) and may range from, for example, about 20 at % to about 80 at %. The content of indium (In) in an upper portion of the source pattern IGP2 may be higher than the content of indium (In) in a lower portion of the source pattern IGP2. For example, the content of indium (In) in the source pattern IGP2 may become progressively higher toward an interface between the source pattern IGP2 and the channel pattern CH (i.e., the fourth level LV4). The content property of indium may prevent a silicon oxide layer from being formed between the source pattern IGP2 and the channel pattern CH, thereby reducing a contact resistance between the source pattern IGP2 and the channel pattern CH. Other features and components may be the same/similar as described with reference to FIG. 4A.

Figure 4C:
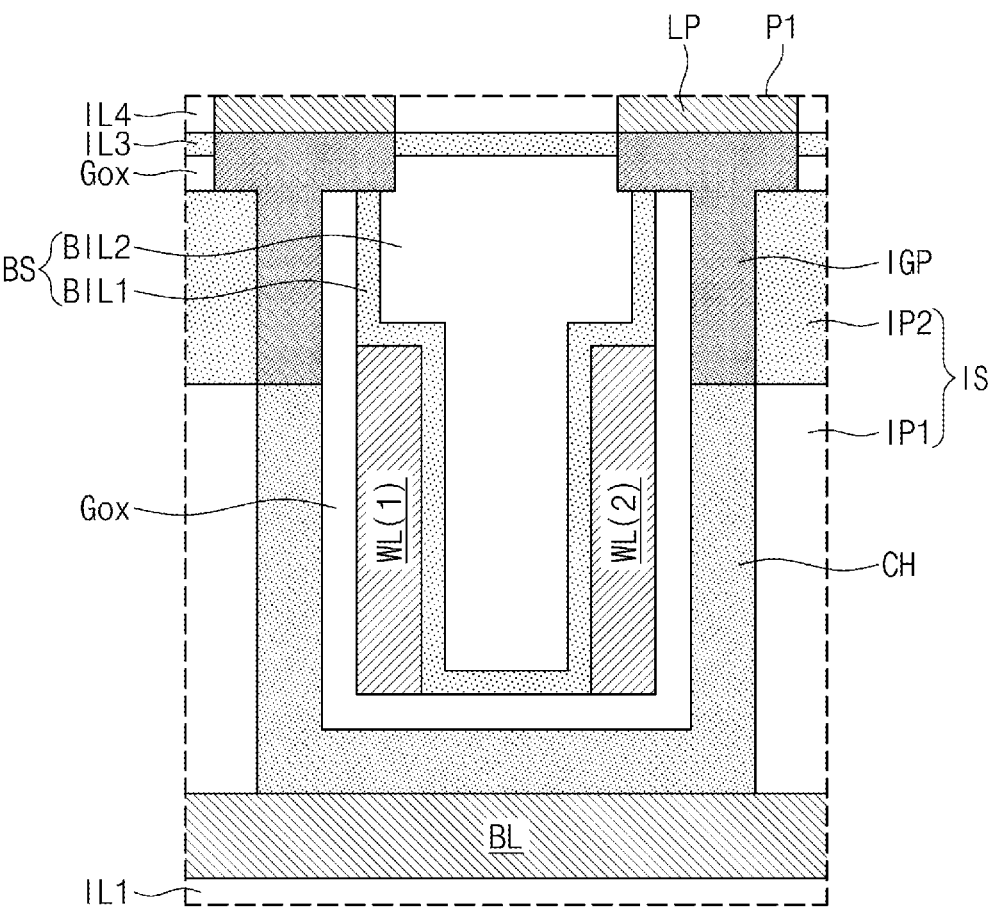

Referring to FIG. 4C, a channel pattern CH may have a U-shaped cross section. The channel pattern CH may be adjacent to the pair of word lines WL(1) and WL(2) disposed between the first insulating structures IS and may cover (i.e., extend on or over) the top surface of the bit line BL therebetween. The channel pattern CH may be disposed between the first word line WL(1) and the channel pattern CH adjacent thereto and may extend to be disposed between the second word line WL(2) and the channel pattern CH adjacent thereto. Other features and components may be the same/similar as described with reference to FIG. 4A.

Figure 4D:
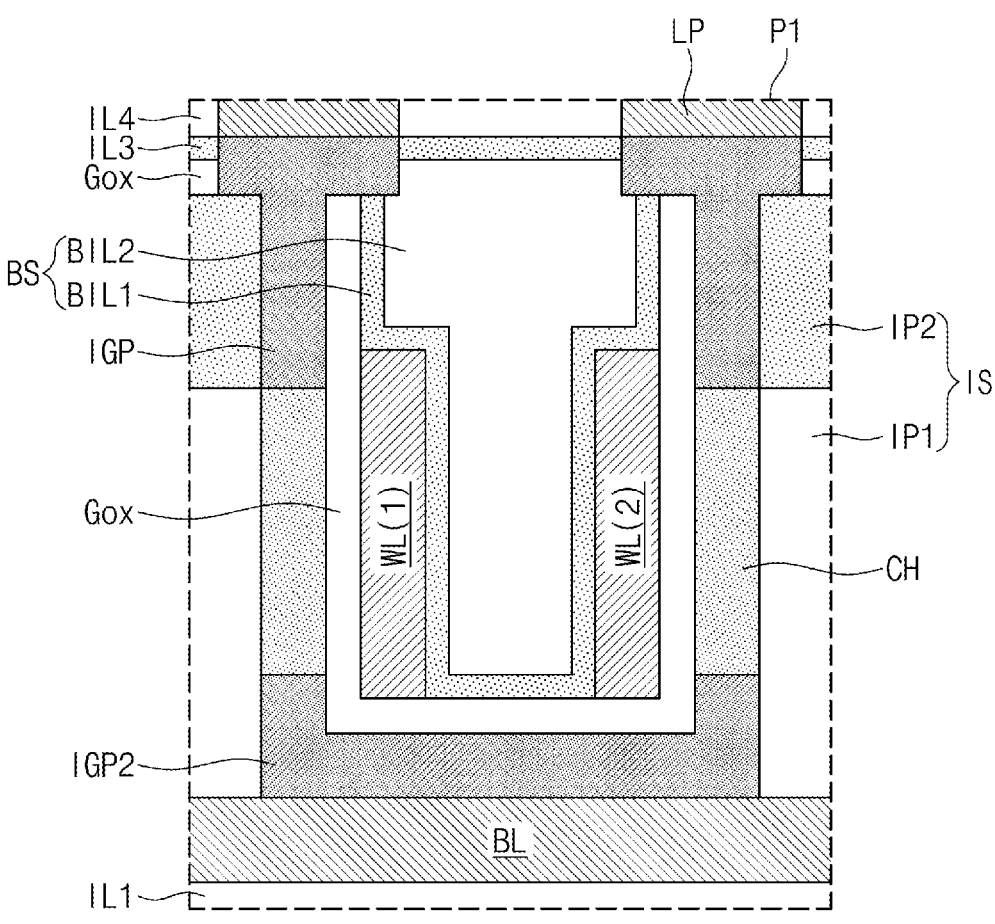

Referring to FIG. 4D, a source pattern IGP2 may be disposed between the channel pattern CH and the bit line BL. The source pattern IGP2 may have a U-shaped cross section. The source pattern IGP2 may connect the channel pattern CH adjacent to the first word line WL(1) and the channel pattern CH adjacent to the second word line WL(2) and may be in contact with the top surface of the bit line BL therebetween. Other features and components may be the same/similar as described with reference to FIGS. 4A and 4B.

Figure 4E:
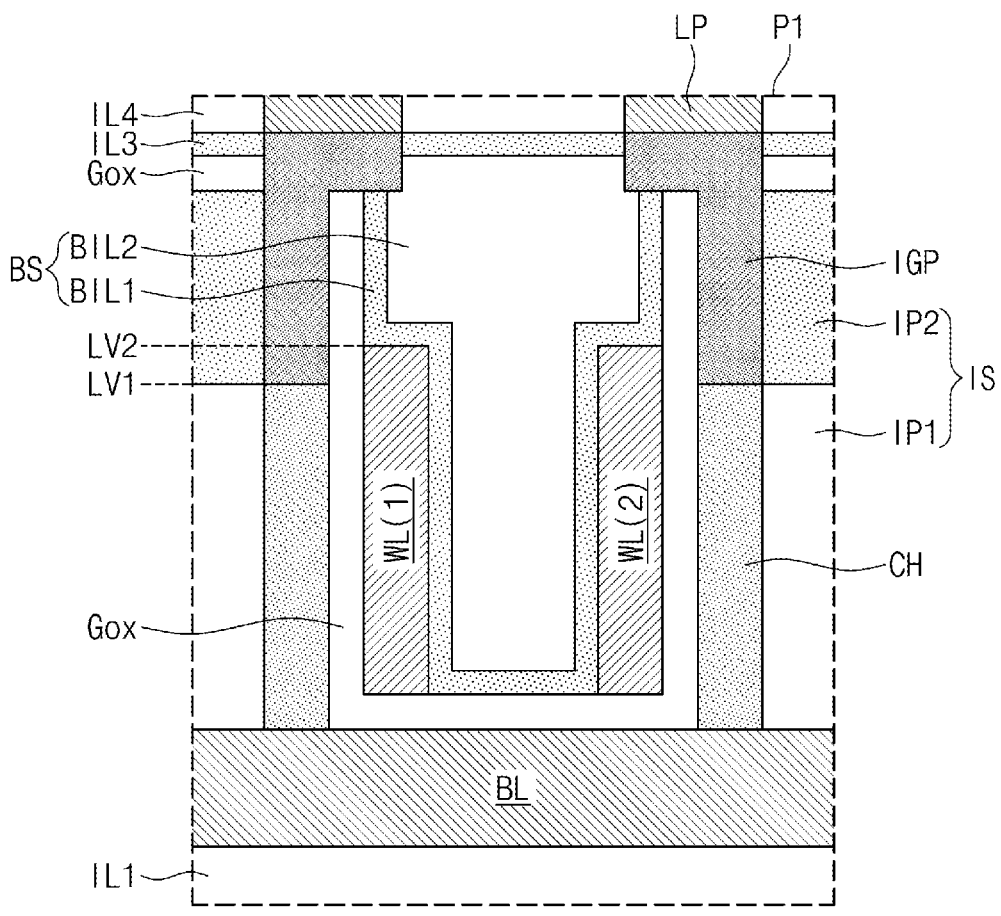

Referring to FIG. 4E, a drain pattern IGP may penetrate (i.e., extend at least partially into) the third interlayer insulating layer IL3 and the gate insulating layer Gox and may be disposed between the upper portion of the second insulating structure BS and the upper portion of the first insulating structure IS. The drain pattern IGP may not vertically overlap the first insulating structure IS. In the present embodiments, the drain pattern IGP may have an inverted L-shaped cross section, although the present disclosure is not limited thereto. Other features and components may be the same/similar as described with reference to FIG. 4A.

Figure 4F:
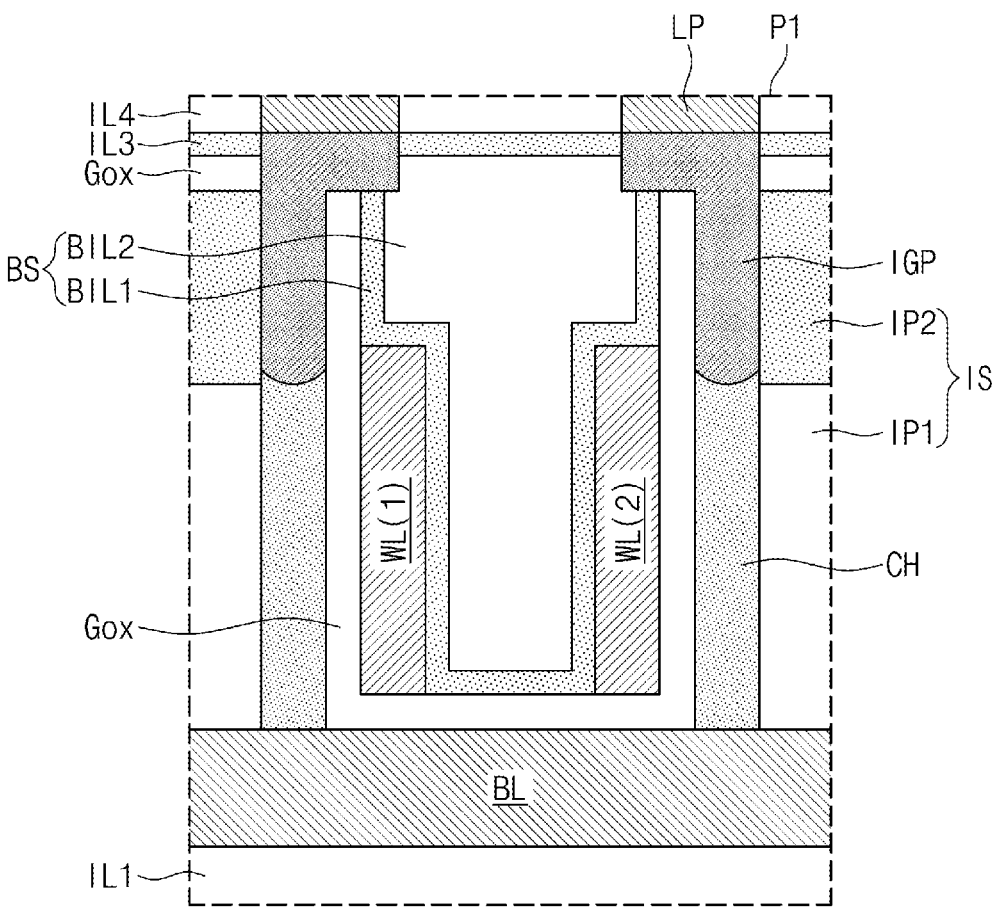

Referring to FIG. 4F, a top surface of the channel pattern CH may be recessed (i.e., concave). A bottom surface of the drain pattern IGP may be rounded so as to match the top surface of the channel pattern CH. Other features and components may be the same/similar as described with reference to FIG. 4A.

FIGS. 5A, 6A, 7A, 8A, 9A, 10A, 11A, 12A, 13A, 14A, 15A, 16A and 17A are plan views illustrating intermediate processes relating to an example method of manufacturing the semiconductor memory device of FIG. 3A. FIGS. 5B, 6B, 7B, 8B, 9B, 10B, 11B, 12B, 13B, 14B, 15B, 16B and 17B are cross-sectional views taken along lines A-A', B-B' and C-C' of FIGS. 5A to 17A to illustrate intermediate processes relating to an example method of manufacturing the semiconductor memory device of FIG. 3B. FIG. 13C is a cross-sectional view illustrating a method of manufacturing the semiconductor memory device of FIG. 3B.

Figure 5A:
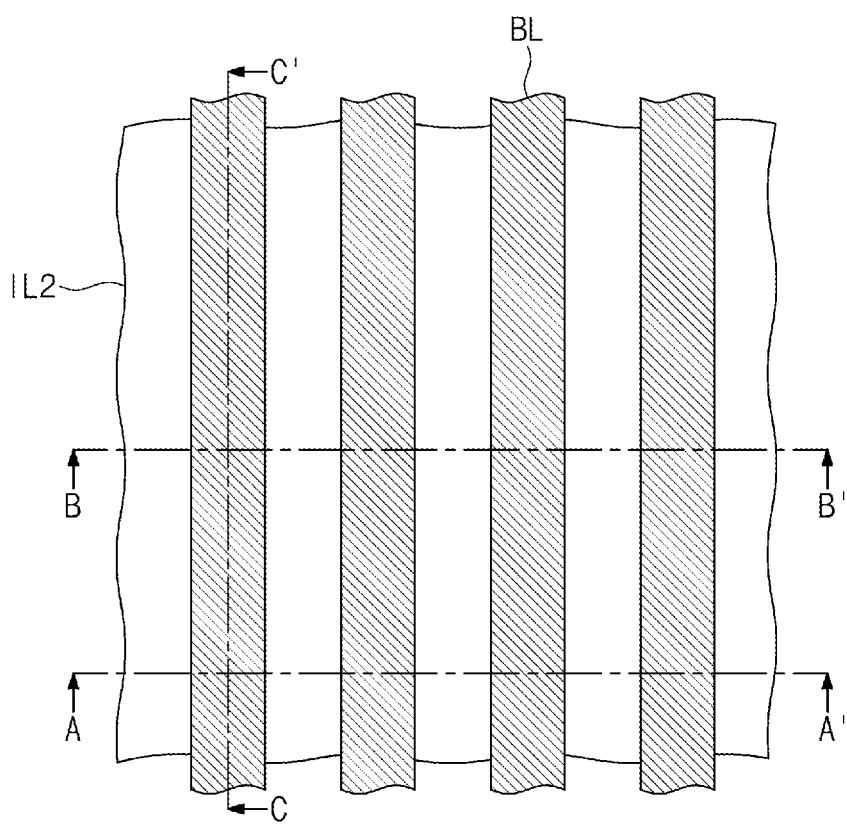
FIGS. 5A, 6A, 7A, 8A, 9A, 10A, 11A, 12A, 13A, 14A, 15A, 16A and 17A are plan views illustrating intermediate processes in an example method of manufacturing the semiconductor memory device of FIGS. 3A and 3B.
Figure 5A:
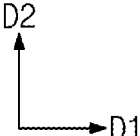
Figure 5B:
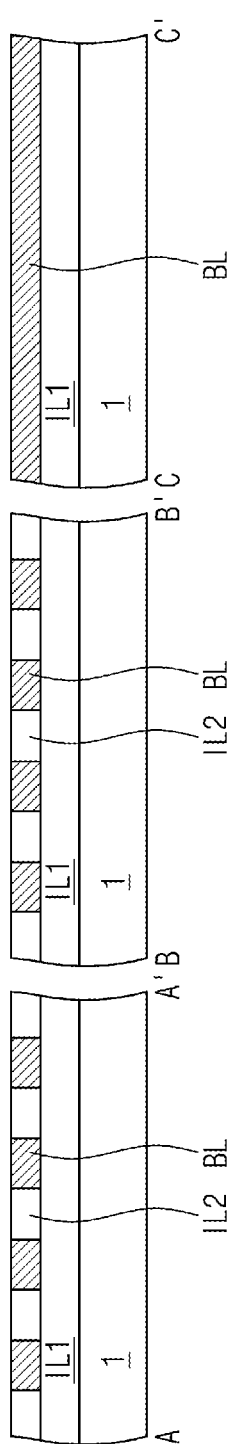
FIGS. 5B, 6B, 7B, 8B, 9B, 10B, 11B, 12B, 13B, 14B, 15B, 16B and 17B are cross-sectional views taken along lines A-A', B-B' and C-C' of FIGS. 5A to 17A to illustrate intermediate processes in an example method of manufacturing the semiconductor memory device of FIGS. 3A and 3B.

Referring to FIGS. 5A and 5B, a first interlayer insulating layer IL1 may be formed on a substrate 1. The first interlayer insulating layer IL1 may be formed to have a single-layered or multi-layered structure including, for example, at least one of silicon oxide, silicon nitride, silicon oxynitride, or a porous insulating material. Bit lines BL may be formed on the first interlayer insulating layer IL1. The bit lines BL may extend in the second direction D2 and may be spaced apart from each other in the first direction D1; the first and second directions D1, D2 are parallel to a top surface of the substrate 1. A conductive layer may be deposited on the first interlayer insulating layer IL1, and then, the deposited conductive layer may be patterned to form the bit lines BL. A second interlayer insulating layer IL2 may be formed to fill a space between the bit lines BL. The second interlayer insulating layer IL2 may be formed to have a single-layered or multi-layered structure including, for example, at least one of silicon oxide, silicon nitride, silicon oxynitride, or a porous insulating material.

Figure 6A:
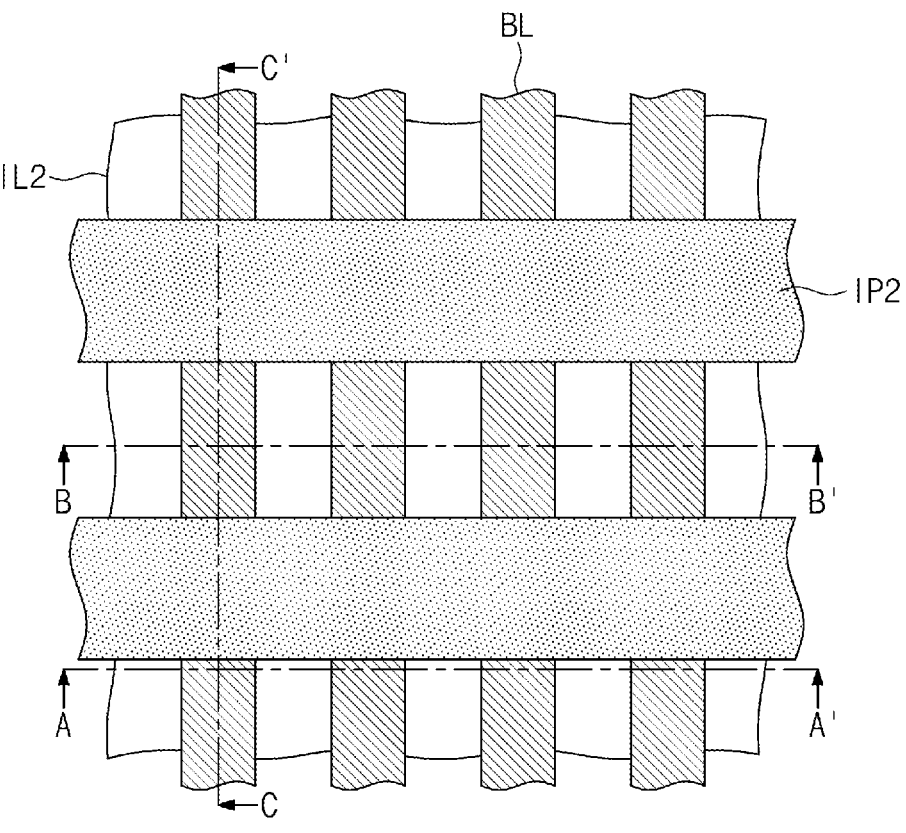
Figure 6A:
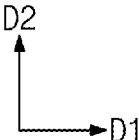
Figure 6B:
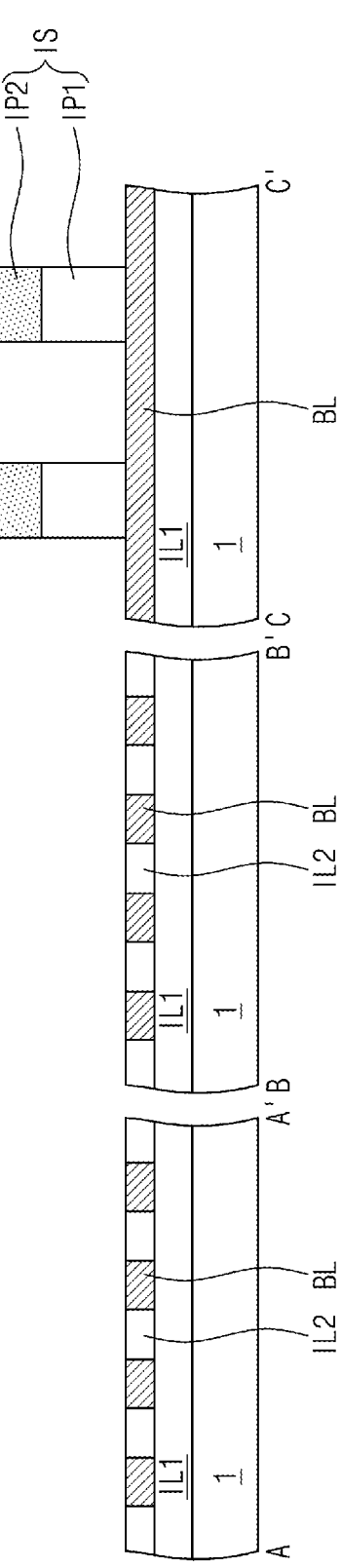

Referring to FIGS. 6A and 6B, a first insulating layer and a second insulating layer may be sequentially formed on the first interlayer insulating layer IL1 and the bit lines BL and may be patterned to form first insulating structures IS, each of which has a first insulating pattern IP1 and a second insulating pattern IP2. The first insulating structures IS may have line shapes extending in the first direction D1 and may be spaced apart from each other in the second direction D2.

Figure 7A:
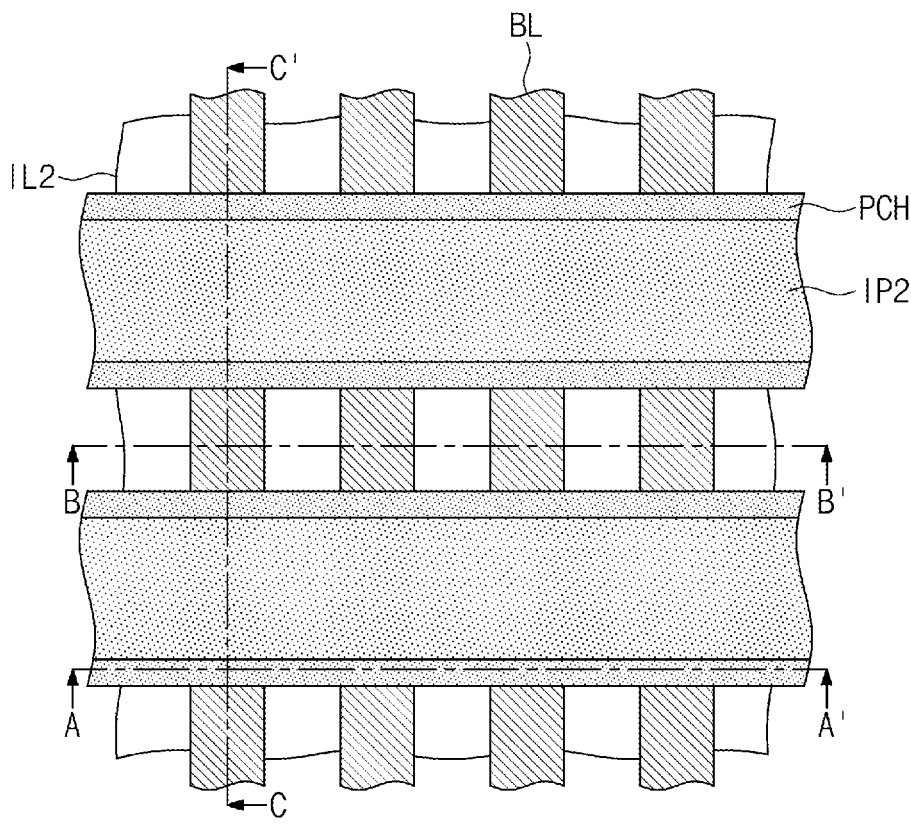
Figure 7A:
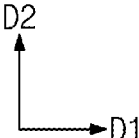
Figure 7B:
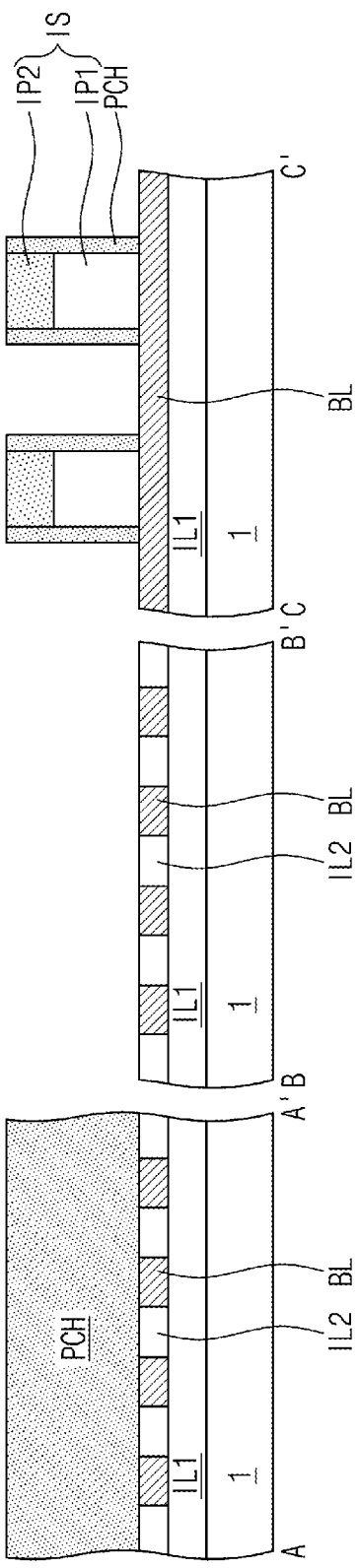

Referring to FIGS. 7A and 7B, a channel layer may be conformally formed on an entire top surface of the substrate 1 and then may be anisotropically etched to form preliminary channel patterns PCH covering both side surfaces of each of the first insulating structures IS. The channel layer may be formed of silicon by an atomic layer deposition (ALD) process, although embodiments of the inventive concept are not limited thereto. The preliminary channel patterns PCH may have a line shape when viewed in a plan view. Top surfaces of the first insulating structures IS may be exposed.

Figure 8A:
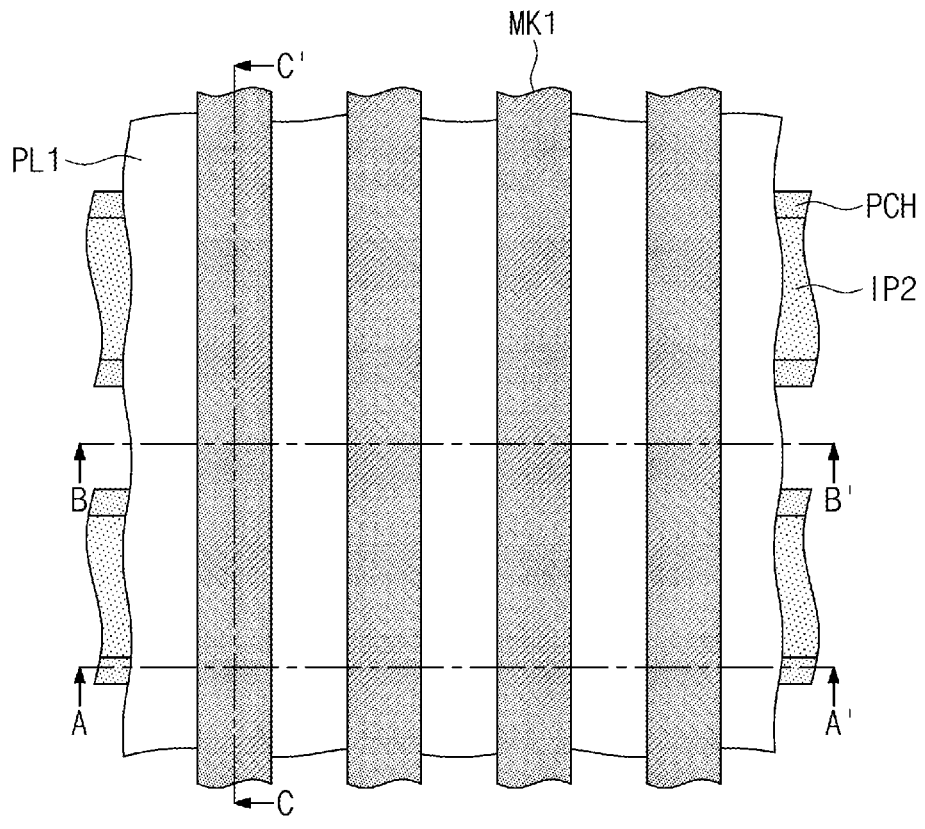
Figure 8A:
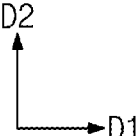
Figure 8B:
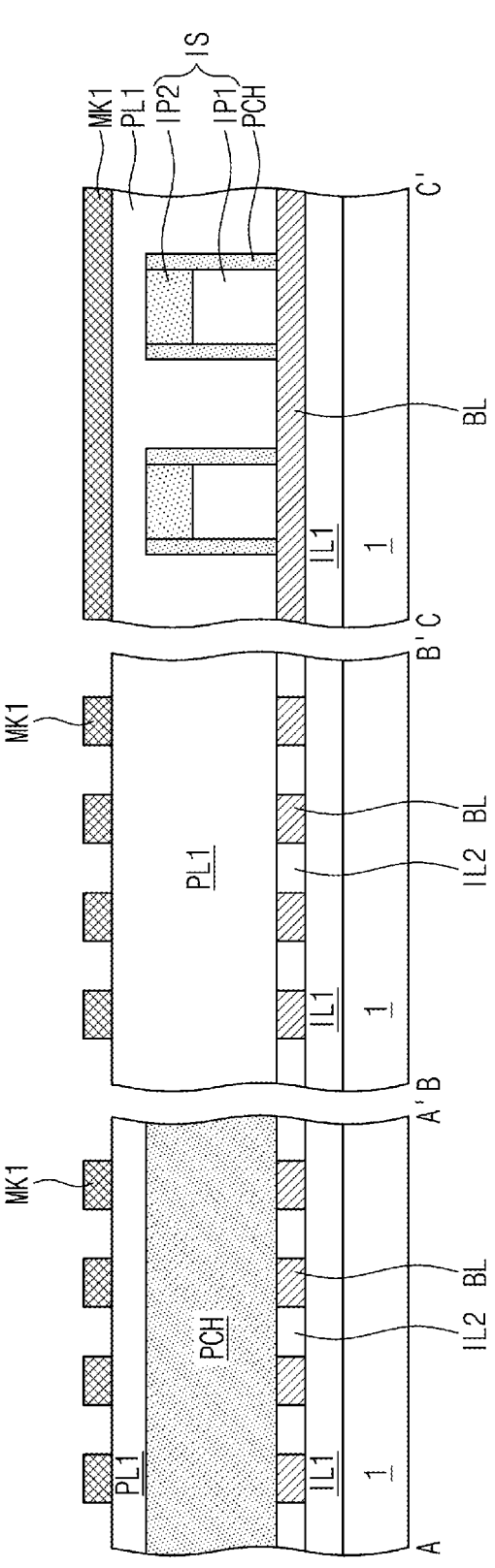
Figure 9A:
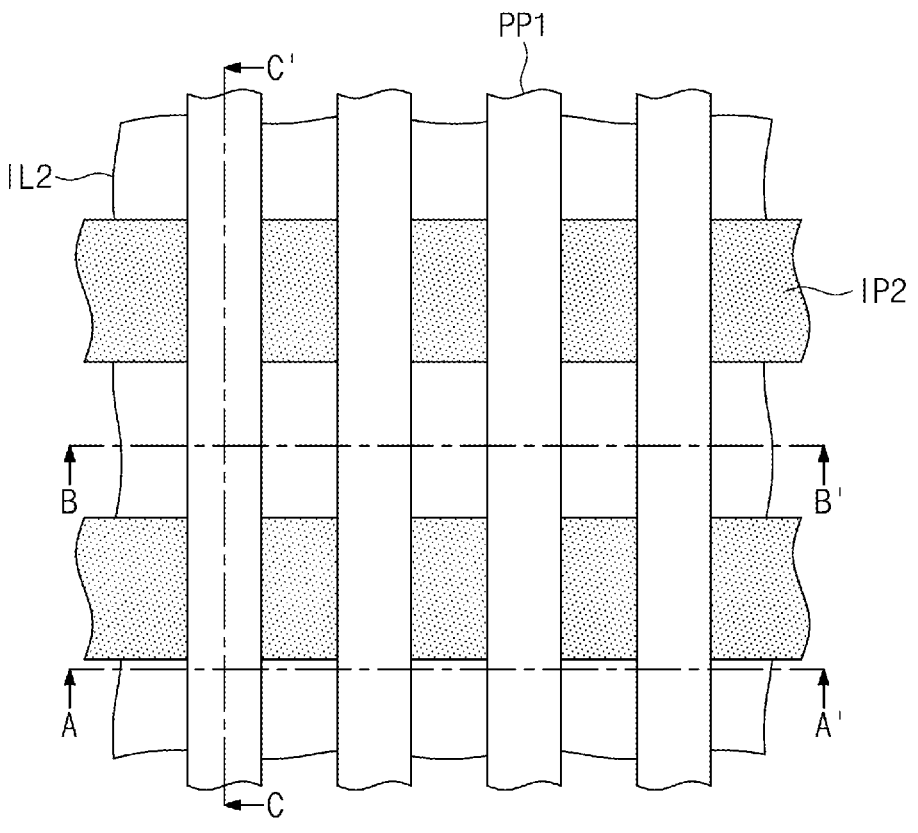
Figure 9A:
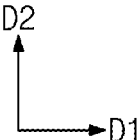
Figure 9B:
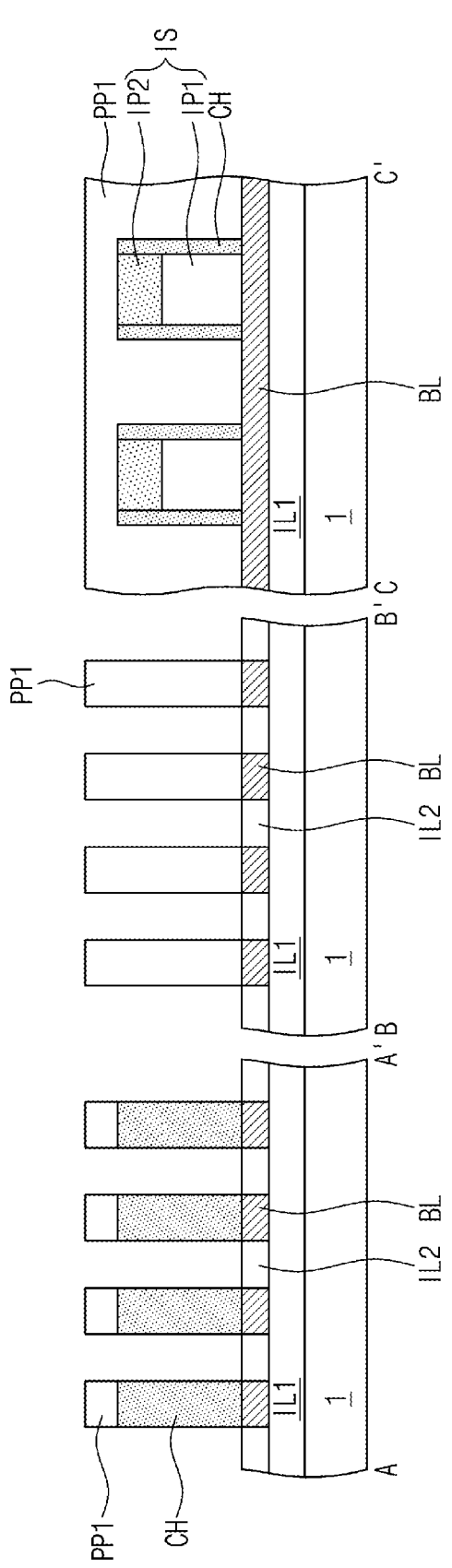
Figure 10A:
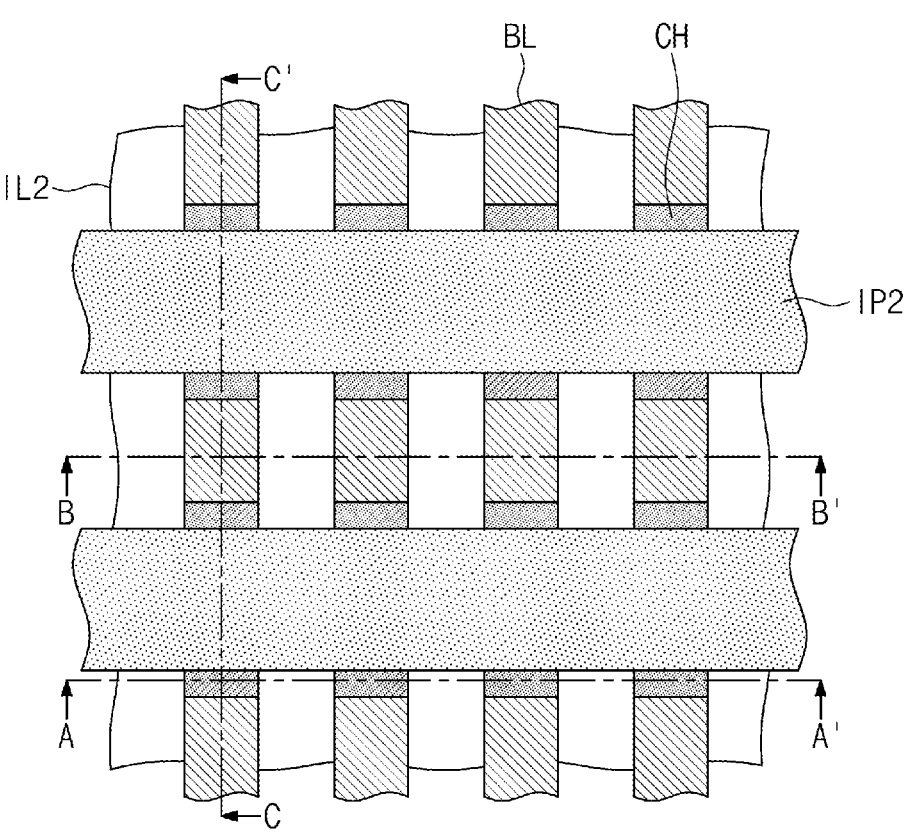
Figure 10A:
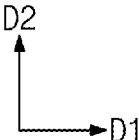
Figure 10B:
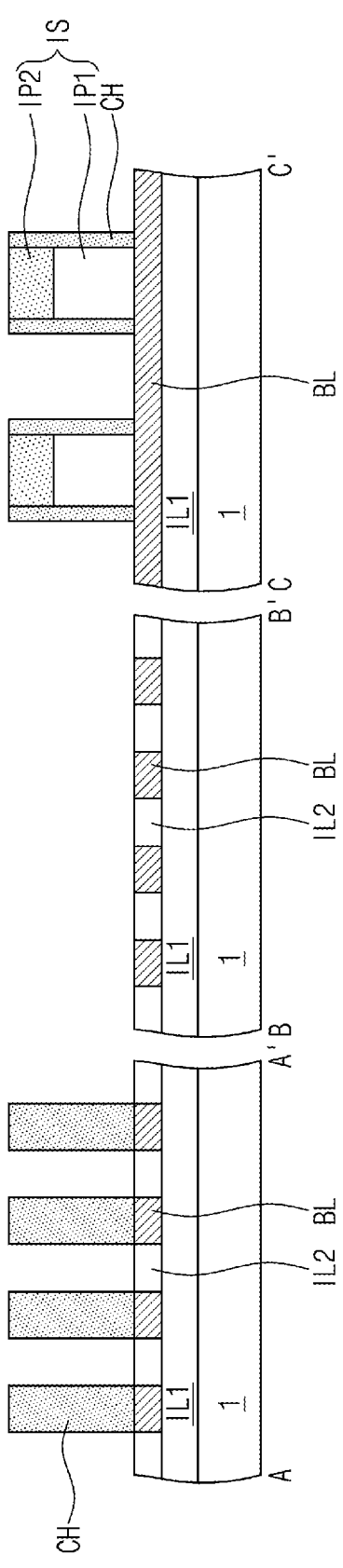

Referring to FIGS. 8A and 8B, a protective layer PL1 may be formed on an entire top surface of the substrate 1 to cover the top surfaces of the first insulating structures IS and top surfaces and side surfaces of the preliminary channel patterns PCH and to fill a space between the first insulating structures IS. For example, the protective layer PL1 may be formed of silicon oxide or spin-on-hardmask (SOH). A top surface of the protective layer PL1 may be substantially flat. First mask patterns MK1 may be formed on the protective layer PL1. The first mask patterns MK1 may have the same/similar shapes and sizes as the bit lines BL. The first mask patterns MK1 may vertically overlap the bit lines BL. The first mask patterns MK1 may have line shapes extending in the second direction D2 and may be spaced apart from each other in the first direction D1. The first mask patterns MK1 may be formed of a material having an etch selectivity with respect to the protective layer PL1. For example, each of the first mask patterns MK1 may have a single-layered or multi-layered structure including at least one of a photoresist material, tungsten, titanium, titanium nitride, silicon-germanium, silicon nitride, or SiCN.

Referring to FIGS. 8A, 8B, 9A and 9B, the protective layer PL1 and the preliminary channel patterns PCH thereunder may be etched using the first mask patterns MK1 as etch masks to expose the top surface of the first insulating structure IS and the top surface of the second interlayer insulating layer IL2 and to form protective patterns PP1 and channel patterns CH. The protective pattern PP1 may correspond to a portion of the protective layer PL1 that remains after the etching process. Likewise, the channel pattern CH may correspond to a portion of the preliminary channel pattern PCH remaining after the etching process. The first mask patterns MK1 may then be removed.

Referring to FIGS. 9A, 9B, 10A and 10B, the protective patterns PP1 may be removed to expose the channel patterns CH, and the bit lines BL and the second interlayer insulating layer IL2 between the channel patterns CH.

Figure 11A:
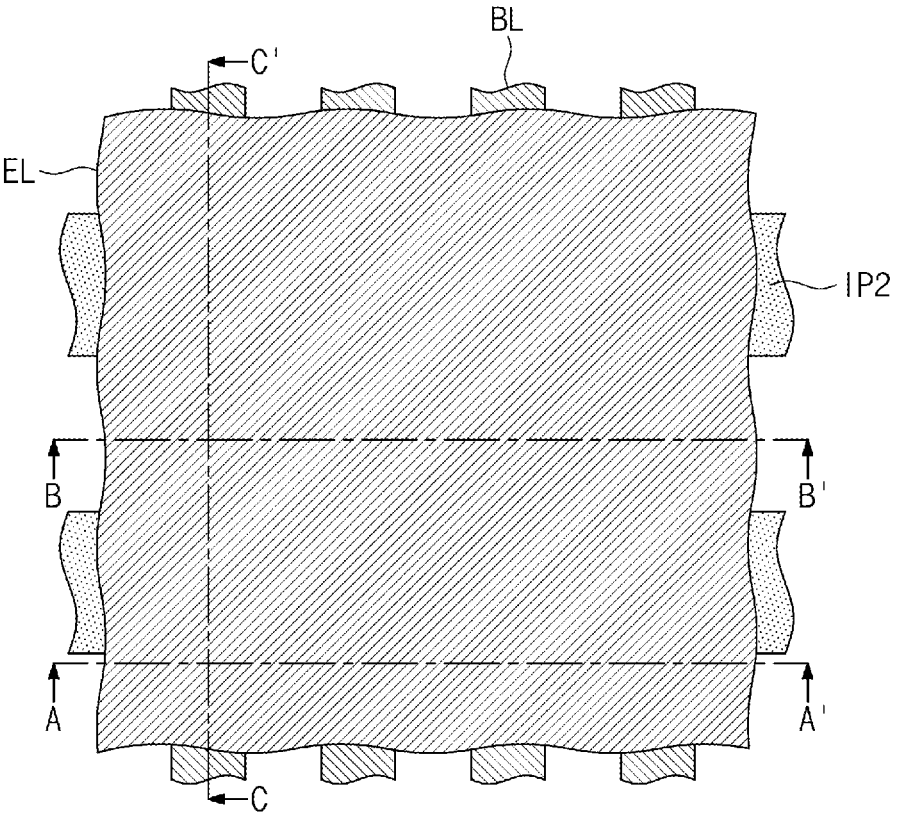
Figure 11A:
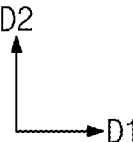
Figure 11B:
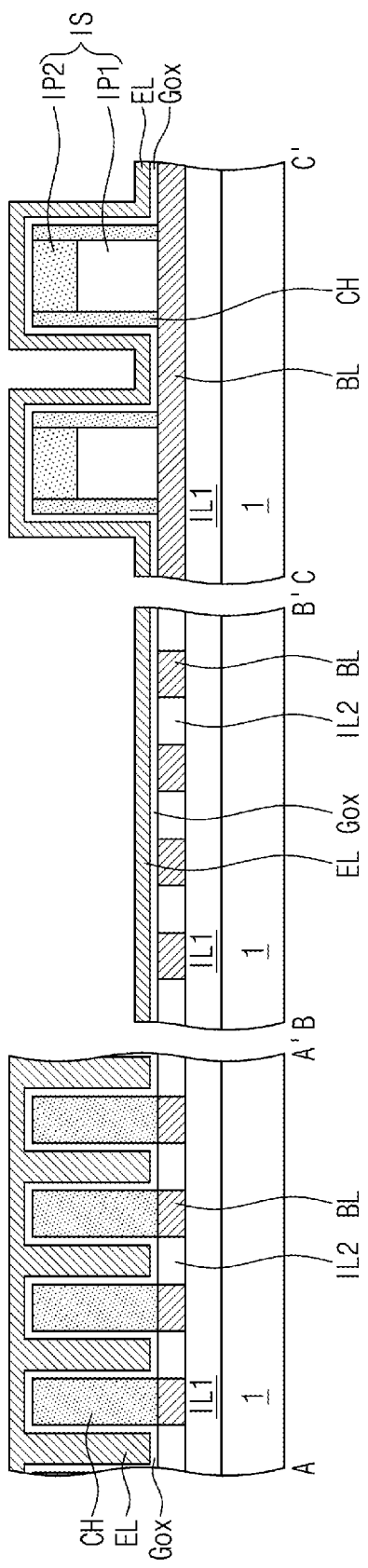

Referring to FIGS. 11A and 11B, a gate insulating layer Gox and an electrode layer EL may be sequentially and conformally formed on an entire top surface of the substrate 1. The gate insulating layer Gox may be formed to have a single-layered or multi-layered structure including at least one of silicon oxide, silicon nitride, or a metal oxide. The electrode layer EL may be formed of, for example, at least one of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, or RuOx. The electrode layer EL may fill a space between the channel patterns CH in the cross section taken along the line A-A'.

Figure 12A:
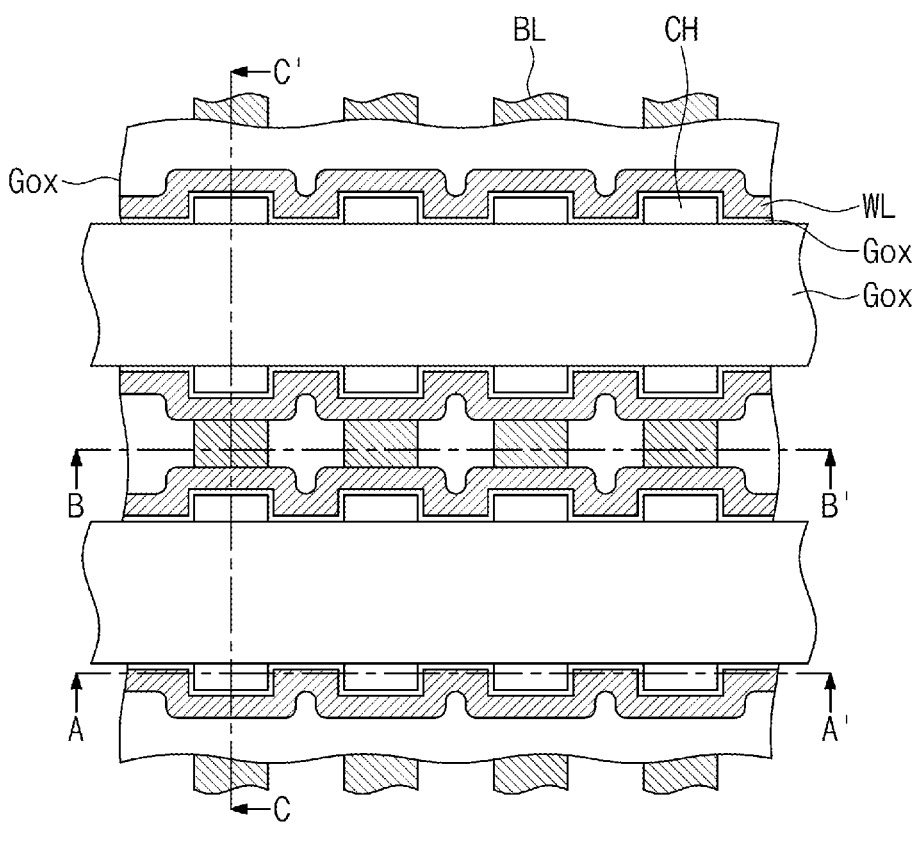
Figure 12A:
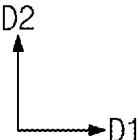
Figure 12B:
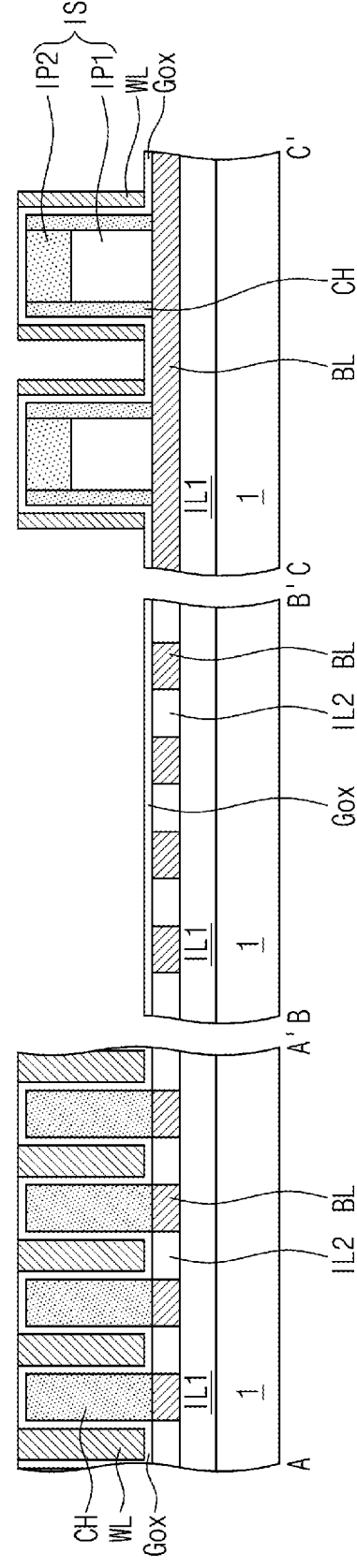

Referring to FIGS. 12A and 12B, an anisotropic etching process may be performed on the electrode layer EL to expose the gate insulating layer Gox and to form word lines WL covering both side surfaces of each of the first insulating structures IS.

Figure 13A:
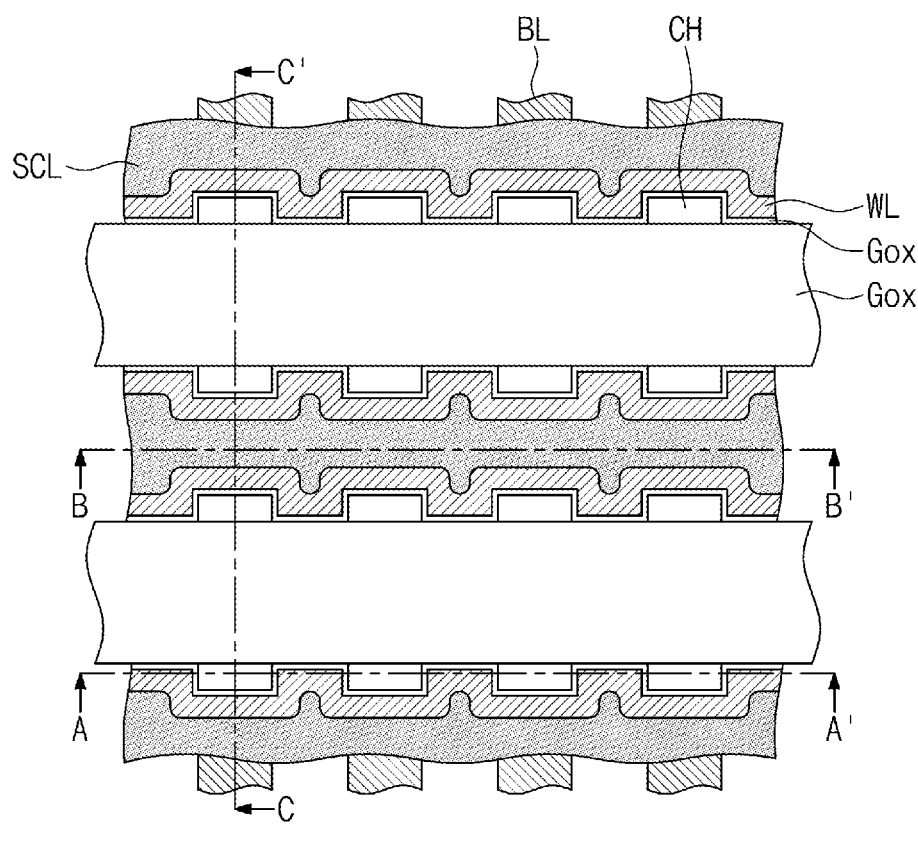
Figure 13A:
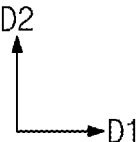
Figure 13B:
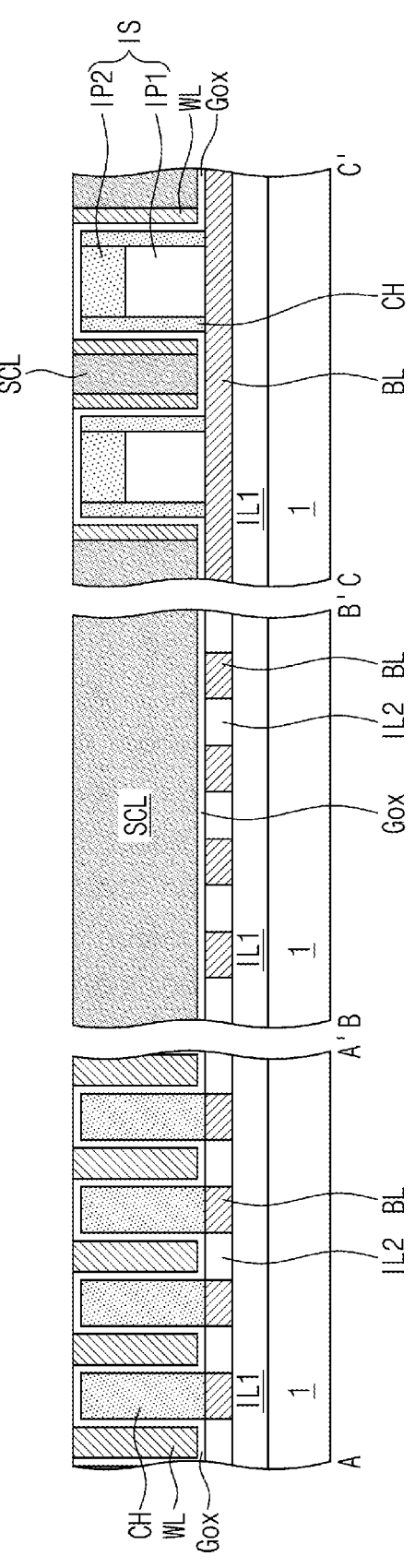
Figure 13C:
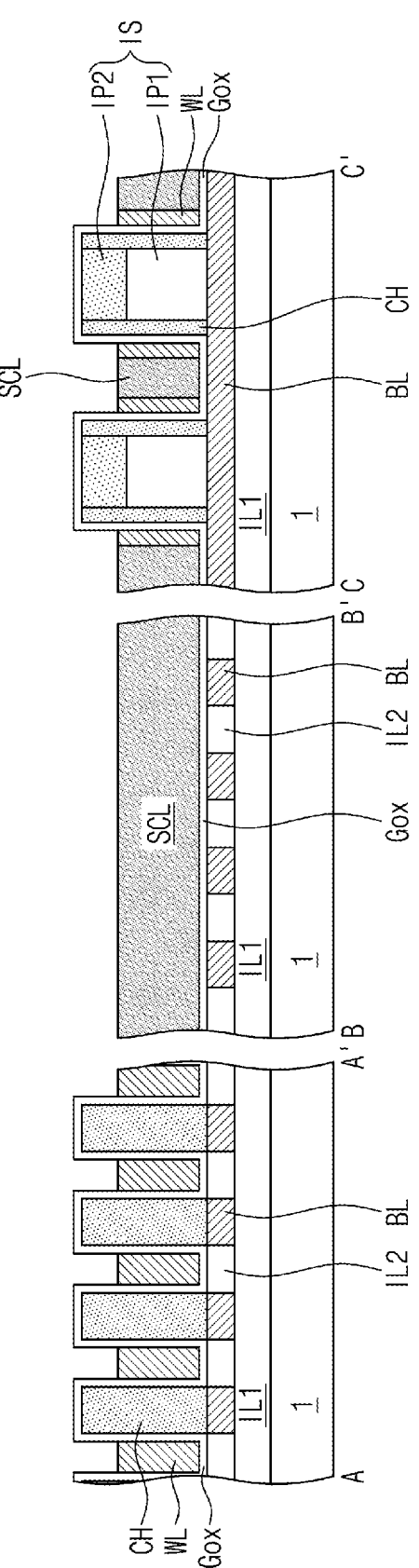
FIG. 13C is a cross-sectional view illustrating a method of manufacturing the semiconductor memory device of FIG. 3B.

Referring to FIGS. 13A and 13B, a sacrificial layer SCL may be formed on the substrate 1 to fill a space between the word lines WL. The sacrificial layer SCL may be formed of spin-on-hardmask (SOH). The sacrificial layer SCL may expose a portion of the gate insulating layer Gox on the first insulating structure IS and the channel patterns CH.

Referring to FIGS. 13A and 13C, upper portions of the sacrificial layer SCL and the word lines WL may be etched to expose the gate insulating layer Gox covering upper portions of the channel patterns CH and the first insulating structures IS.

Figure 14A:
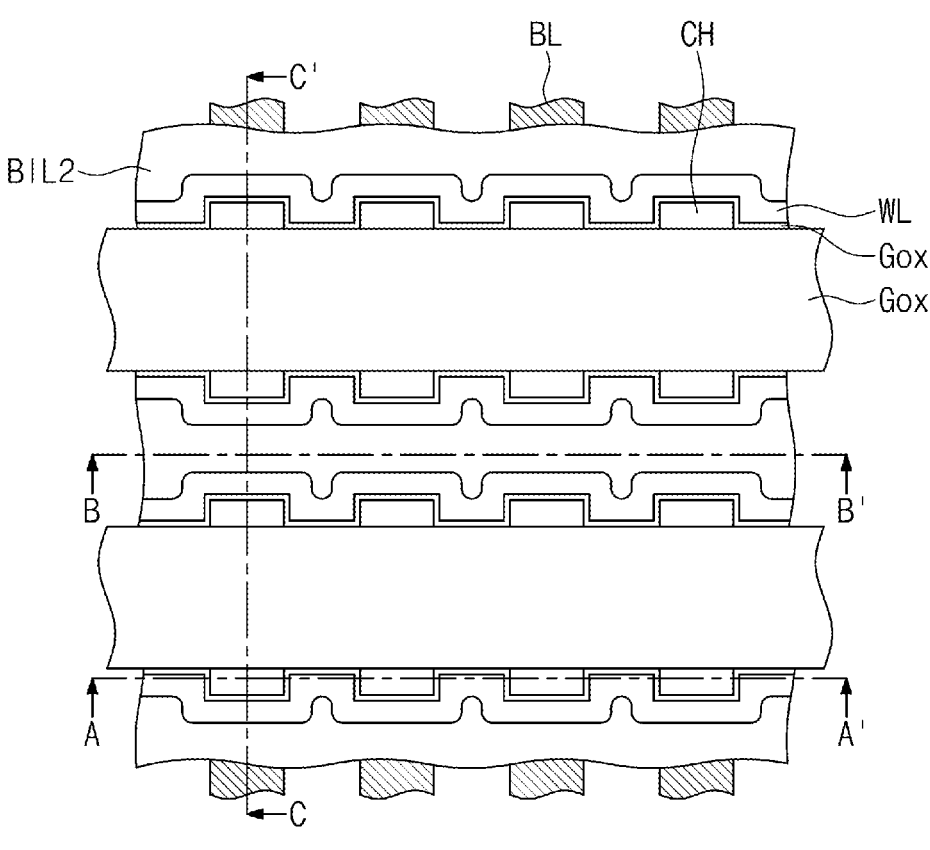
Figure 14A:
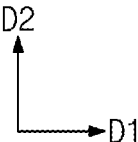
Figure 14B:
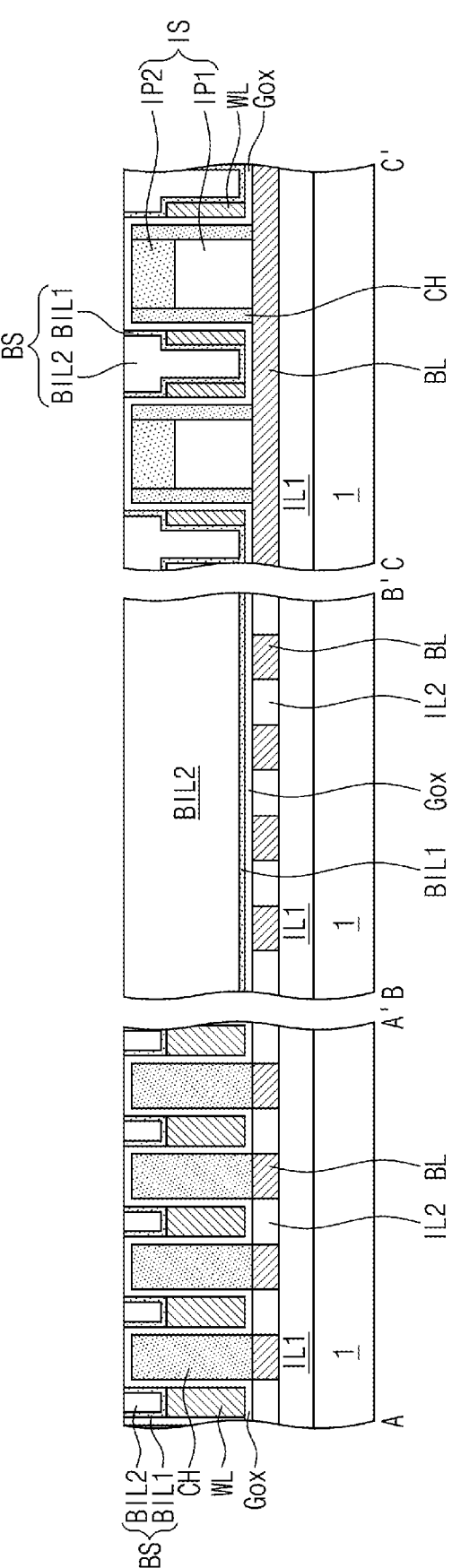

Referring to FIGS. 14A and 14B, a buried liner BIL1 may be conformally formed on an entire top surface of the substrate 1. An insulating buried layer may be formed on the buried liner BIL1 to fill a space between the upper portions of the channel patterns CH, a space between the first insulating structures IS and a space between the word lines WL. An etch-back process may be performed on the insulating buried layer and the buried liner BIL1 to form second insulating structures BS, each of which has a buried pattern BIL2 and the buried liner BIL1. A top surface of the gate insulating layer Gox may be exposed between the second insulating structures BS.

Figure 15A:
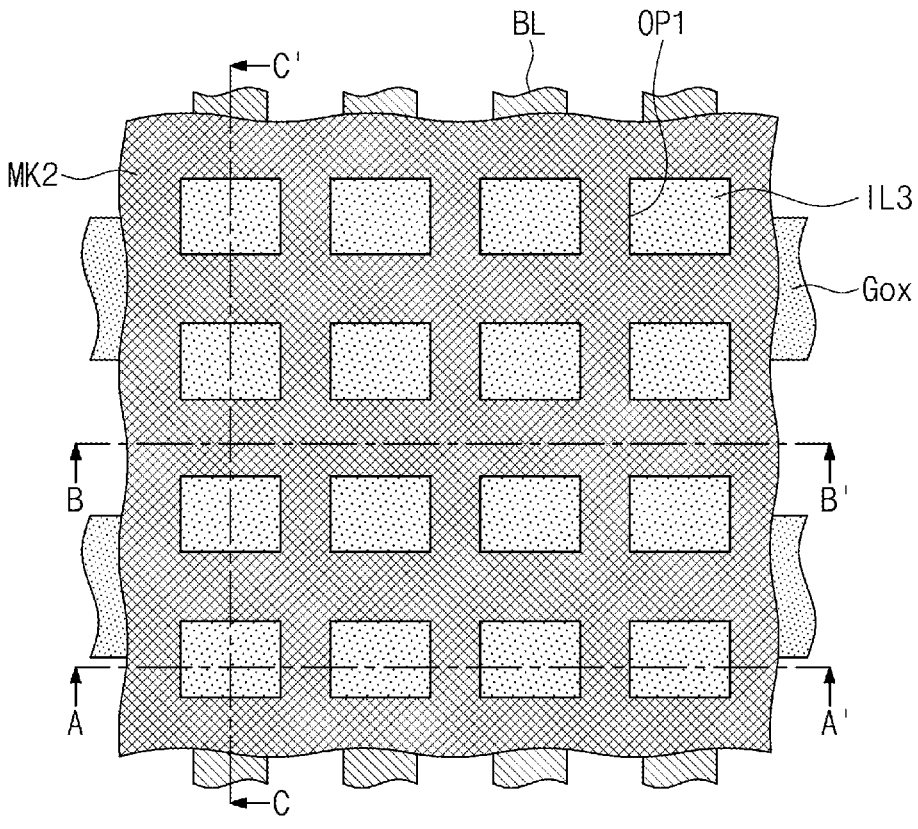
Figure 15A:
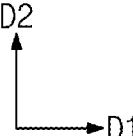
Figure 15B:
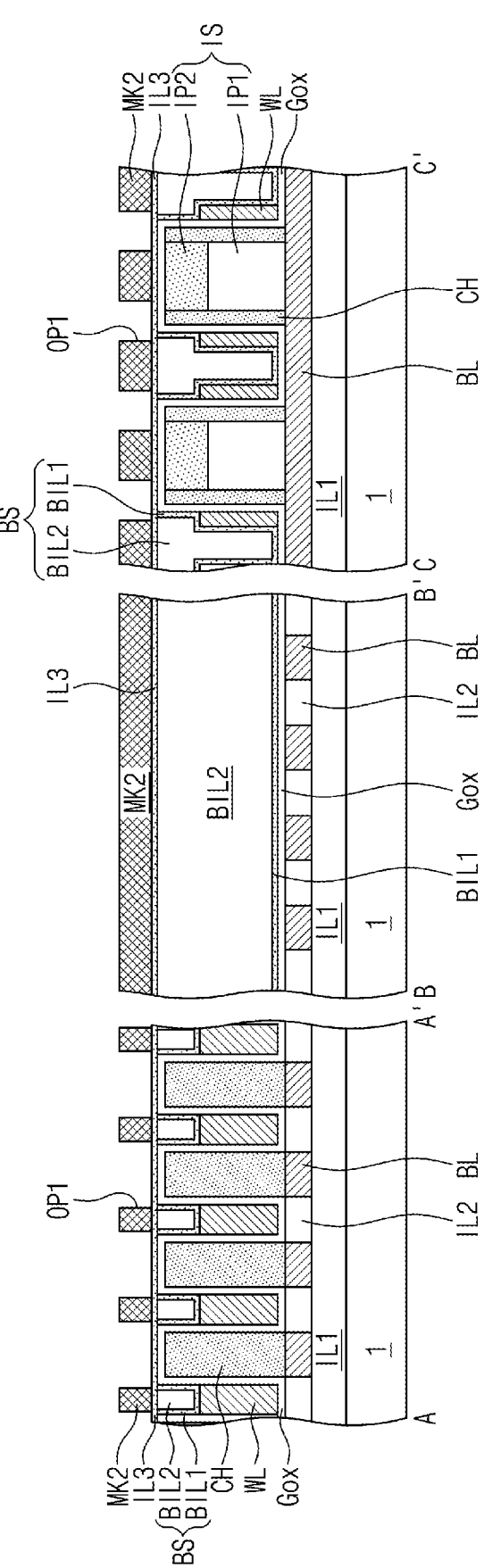
Figure 16A:
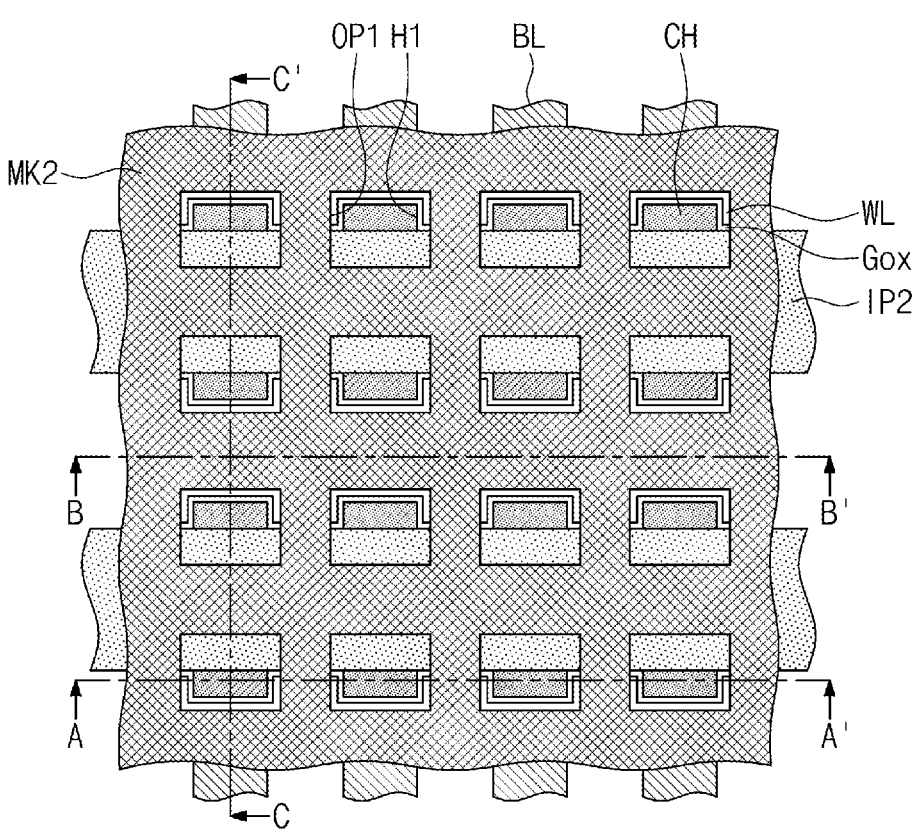
Figure 16A:
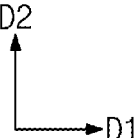
Figure 16B:
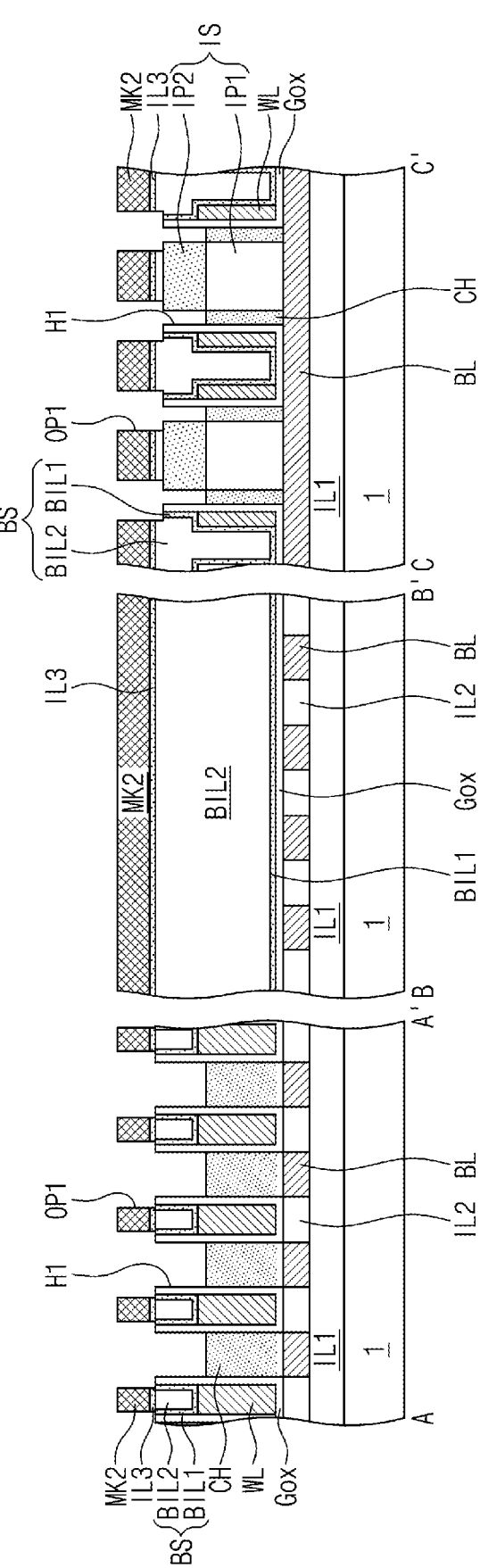
Figure 17A:
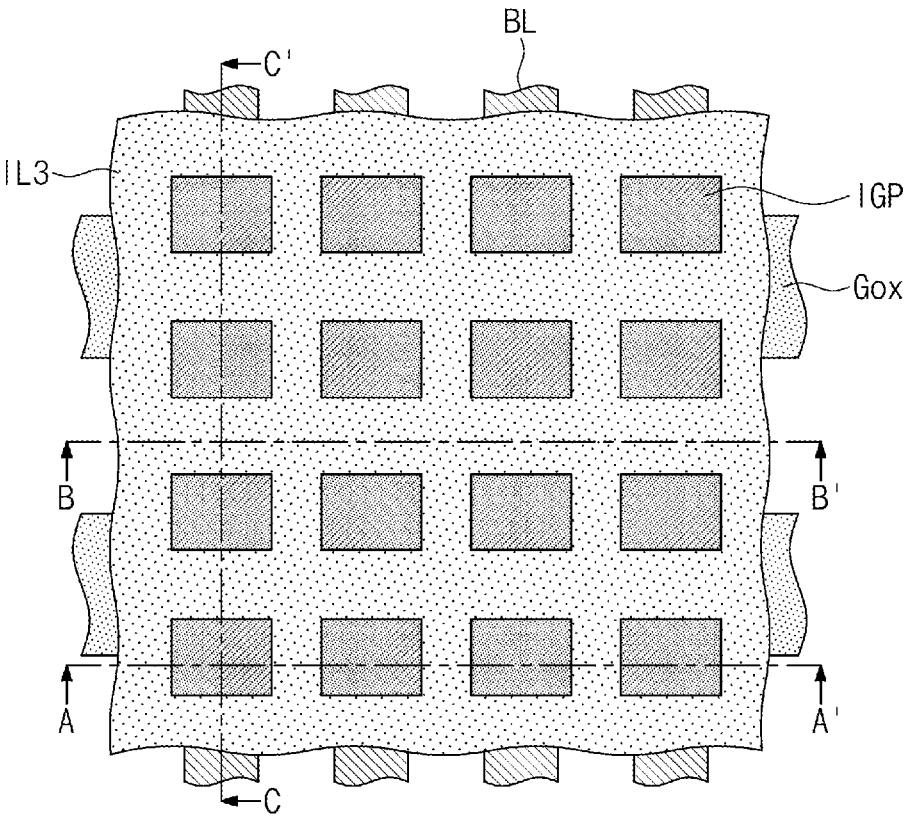
Figure 17B:
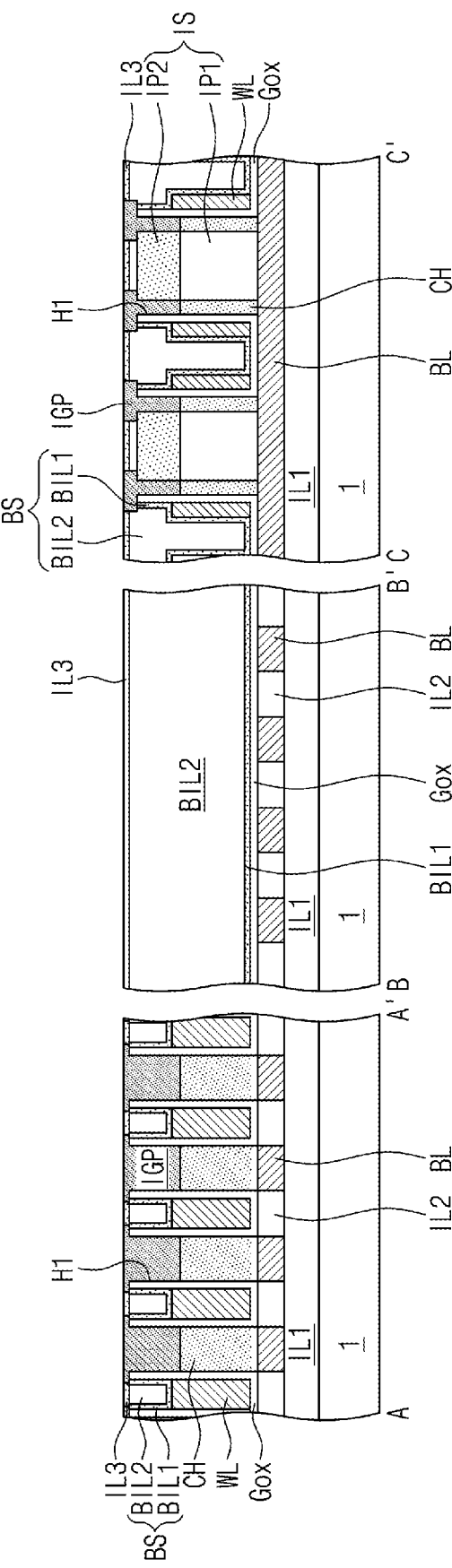

Referring to FIGS. 15A and 15B, a third interlayer insulating layer IL3 may be formed on an entire top surface of the substrate 1. The third interlayer insulating layer IL3 may also be referred to as an etch stop layer or a polishing stop layer. The third interlayer insulating layer IL3 may be formed as a single-layered or multi-layered structure including, for example, at least one of silicon oxide, silicon nitride, silicon oxynitride, or a porous insulating material. A second mask pattern MK2 may be formed on the third interlayer insulating layer IL3. The second mask pattern MK2 may include openings OP1 exposing the third interlayer insulating layer IL3 therethrough. The openings OP1 may vertically overlap the channel patterns CH. For example, the second mask pattern MK2 may have a single-layered or multi-layered structure including at least one of a photoresist material, tungsten, titanium, titanium nitride, silicon-germanium, silicon nitride, or SiCN.

Referring to FIGS. 15A, 15B, 16A and 16B, the third interlayer insulating layer IL3 exposed by the openings OP1 and the gate insulating layer Gox thereunder may be etched using the second mask pattern MK2 as an etch mask to expose top surfaces of the channel patterns CH. Portions of the exposed channel patterns CH may be selectively removed to form first holes H1 exposing upper side surfaces of the first insulating structure IS and the gate insulating layer Gox. Thus, top surfaces of the channel patterns CH may be lower than top surfaces of the word lines WL.

Referring to FIGS. 16A, 16B, 17A and 17B, the second mask pattern MK2 may be removed to expose the third interlayer insulating layer IL3. A drain layer may be formed on an entire top surface of the substrate 1 to fill the first holes H1. The drain layer may be formed using an atomic layer deposition (ALD) process. A supply amount or a supply period of indium (In) may be adjusted when the drain layer is formed, thereby realizing a change in content of indium according to a height (or level) like FIG. 4A. An etch-back process or a polishing process may be performed on the drain layer to expose the top surface of the third interlayer insulating layer IL3 and to form drain patterns IGP in the first holes H1, respectively. The drain patterns IGP may correspond to portions of the drain layer.

Referring again to FIGS. 3A and 3B, a landing pad layer may be formed on the substrate 1 and then may be patterned to form landing pads LP. A fourth interlayer insulating layer IL4 may be formed to fill a space between the landing pads LP. Data storage elements DS may be formed on the landing pads LP, respectively. Thus, the semiconductor memory device of FIGS. 3A and 3B may be manufactured.

According to the embodiments of the inventive concepts, the channel portion of the selection element may be formed of silicon, and thus the threshold voltage may not be changed according to an operating temperature of the selection element. In addition, the drain portion of the selection element may be formed of an oxide semiconductor having the energy band gap higher than that of the channel portion, and thus the gate-induced drain leakage (GIDL) may be reduced or prevented. Accordingly, a loss of charges stored in the data storage element may be reduced or prevented. As a result, the reliability of the semiconductor memory device may be improved.

While the embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a substrate;
a bit line on the substrate and extending in a first direction parallel to a top surface of the substrate;
a channel pattern on a top surface of the bit line and extending in a second direction perpendicular to the top surface of the substrate;
a first drain pattern on the channel pattern, the first drain pattern comprising a first material;
a first word line adjacent to a lower portion of the first drain pattern and the channel pattern; and
a gate insulating layer between the lower portion of the first drain pattern and the first word line and between the channel pattern and the first word line,
wherein the channel pattern comprises a second material, and an energy band gap of the first material is greater than an energy band gap of the second material.

2. The semiconductor memory device of claim 1, wherein a bottom surface of the first drain pattern has a first level above the top surface of the substrate in the second direction, and

wherein a top surface of the first word line has a second level above the top surface of the substrate in the second direction that is higher than the first level.

3. The semiconductor memory device of claim 1, wherein the first drain pattern has a T-shaped cross section.

4. The semiconductor memory device of claim 1, further comprising:
a source pattern between the channel pattern and the bit line, the source pattern comprising a third material,
wherein an energy band gap of the third material is greater than the energy band gap of the second material.

5. The semiconductor memory device of claim 4, wherein a top surface of the source pattern has a first level above the top surface of the substrate in the second direction, and
wherein a bottom surface of the first word line has a second level above the top surface of the substrate in the second direction that is lower than the first level.

6. The semiconductor memory device of claim 1, further comprising:
a second drain pattern spaced apart from the first drain pattern in the first direction; and
a second word line adjacent to a lower portion of the second drain pattern,
wherein the gate insulating layer and the channel pattern extend on bottom surfaces of the first and second word lines and further extend onto a side surface of the second word line,
wherein the gate insulating layer is between the lower portion of the second drain pattern and the second word line and between the channel pattern and the second word line, and
wherein the channel pattern is in contact with a bottom surface of the second drain pattern.

7. The semiconductor memory device of claim 1, further comprising:
a landing pad on the first drain pattern,
wherein the channel pattern has a first width in the first direction,
wherein the landing pad has a second width in the first direction, and the second width is greater than the first width.

8. The semiconductor memory device of claim 1, wherein an upper portion of the first drain pattern extends in the first direction to at least partially overlap the first word line in a plan view.

9. The semiconductor memory device of claim 1, wherein the first word line extends in a third direction which is parallel to the top surface of the substrate and intersects the first direction, and
wherein a side surface of the first word line, which is spaced apart from the gate insulating layer, has an uneven contour when viewed in a plan view.

10. The semiconductor memory device of claim 1, wherein the channel pattern comprises silicon, and
wherein the first drain pattern comprises an oxide semiconductor.

11. The semiconductor memory device of claim 10, wherein the oxide semiconductor comprises $In_xGa_yZn_zO$, $In_xGa_ySi_zO$, $In_xSn_yZn_zO$, $In_xZn_yO$, $In_xGa_yO$, $In_2O_3$, or $In_xSn_yO$, and a content of indium (In) in the oxide semiconductor is greater than a content of gallium (Ga), zinc (Zn) or tin (Sn) in the oxide semiconductor.

12. The semiconductor memory device of claim 11, wherein a content of indium (In) in the lower portion of the first drain pattern is greater than a content of indium (In) in an upper portion of the first drain pattern.

13. A semiconductor memory device, comprising:

a substrate;

a bit line on the substrate and extending in a first direction parallel to a top surface of the substrate;

a first word line on the bit line in a second direction parallel to the top surface of the substrate and intersecting the first direction;

a channel pattern on a top surface of the bit line and adjacent to a side of the first word line;

a first drain pattern in contact with a top surface of the channel pattern, the first drain pattern comprising a first material;

a gate insulating layer between the channel pattern and the first word line; and a landing pad on the first drain pattern, wherein a lower portion of the first drain pattern overlaps the first word line in the first direction and/or the second direction, wherein an upper portion of the first drain pattern overlaps the first word line in a third direction perpendicular to the top surface of the substrate, and wherein the channel pattern includes a second material different from the first material of the first drain pattern.

14. The semiconductor memory device of claim 13, wherein the channel pattern comprises silicon, and wherein the first drain pattern comprises an oxide semiconductor.

15. The semiconductor memory device of claim 13, further comprising:

a source pattern between the channel pattern and the bit line, wherein the source pattern includes a third material different from the second material of the channel pattern.

16. The semiconductor memory device of claim 15, wherein a top surface of the source pattern has a first level above the top surface of the substrate in the third direction, and wherein a bottom surface of the first word line has a second level above the top surface of the substrate in the third direction that is lower than the first level.

17. A semiconductor memory device, comprising:

a substrate;

a first interlayer insulating layer on the substrate;

bit lines extending in a first direction on the first interlayer insulating layer and spaced apart from each other in a second direction intersecting the first direction, the first and second directions parallel to a top surface of the substrate;

a second interlayer insulating layer filling a space between the bit lines;

a first insulating structure on the bit lines and the second interlayer insulating layer and extending in the second direction;

channel patterns in contact with a side surface of the first insulating structure and spaced apart from each other in the second direction, the channel patterns connected to the bit lines, respectively;

a first word line covering side surfaces of the channel patterns and extending in the second direction;

a gate insulating layer between the first word line and the channel patterns;

drain patterns between the first word line and the first insulating structure and in contact with top surfaces of the channel patterns, respectively; and landing pads on the drain patterns, wherein the channel patterns include silicon, wherein the drain patterns include an oxide semiconductor, wherein respective bottom surfaces of the drain patterns is at a first level above the top surface of the substrate in a third direction perpendicular to the top surface of the substrate, and wherein a top surface of the first word line is at a second level above the top surface of the substrate in the third direction that is higher than the first level.

18. The semiconductor memory device of claim 17, wherein upper portions of the drain patterns at least partially overlap the first word line in the third direction.

19. The semiconductor memory device of claim 17, further comprising:

at least one source pattern between the channel patterns and the bit line.

20. The semiconductor memory device of claim 17, further comprising:

a second insulating structure on the bit lines and the second interlayer insulating layer, the second insulating structure extending in the second direction and is spaced apart from the first insulating structure;

a second word line on a side surface of the second insulating structure and extending in the second direction; and a third insulating structure at least partially filling a space between the first insulating structure and the second insulating structure, wherein the first word line is between the first insulating structure and the third insulating structure, wherein the second word line is between the second insulating structure and the third insulating structure, and wherein the third insulating structure is on the top surface of the first word line and a top surface of the second word line.

*    *    *    *    *